United States Patent [19]
Deguchi et al.

[11] Patent Number: 5,540,183
[45] Date of Patent: Jul. 30, 1996

[54] ZONE-MELTING RECRYSTALLIZATION OF SEMICONDUCTOR MATERIALS

[75] Inventors: Mikio Deguchi; Hideo Naomoto; Satoshi Arimoto, all of Amagasaki, Japan

[73] Assignee: Mitsubishi Denki Kabushiki Kaisha, Tokyo, Japan

[21] Appl. No.: 213,051

[22] Filed: Mar. 15, 1994

[30] Foreign Application Priority Data

Mar. 16, 1993 [JP] Japan ..................... 5-055253
Dec. 15, 1993 [JP] Japan ..................... 5-314693

[51] Int. Cl.$^6$ ..................... C30B 35/00
[52] U.S. Cl. ............ 117/200; 117/202; 117/204
[58] Field of Search ............... 117/3, 4, 10, 46, 117/47, 48, 94, 200, 202, 204; 118/725; 373/139

[56] References Cited

U.S. PATENT DOCUMENTS

| | | | |
|---|---|---|---|
| 4,479,846 | 10/1984 | Smith et al. | 117/43 |
| 4,694,143 | 9/1987 | Nishimura et al. | 117/43 |
| 4,885,052 | 12/1989 | Fan et al. | 117/43 |
| 5,055,157 | 10/1991 | Bleil | 117/33 |
| 5,066,610 | 11/1991 | Chen et al. | 437/83 |
| 5,069,742 | 12/1991 | Bleil | 117/34 |
| 5,160,575 | 11/1992 | Chen | 117/43 |
| 5,228,948 | 7/1993 | Deguchi | 117/43 |

FOREIGN PATENT DOCUMENTS

| | | |
|---|---|---|
| 2610450 | 1/1987 | France . |
| 5731146 | 7/1980 | Japan . |
| 5799747 | 12/1980 | Japan . |

OTHER PUBLICATIONS

Fukami et al, "Improvement In Crystalline Quality Of Silicon On Fused Silica By Zone Melting Recrystallization", Journal Of Electronic Communication Institute, 1986, pp. 1089–1095.

Geis et al, "Zone–Melting Recrystallization Of Encapsulated Silicon Films On $SiO_2$ Morphology And Crystallography", Applied Physics Letters, vol. 40, No. 2, 1982, pp. 158–160.

Stultz et al, "Arc Lamp Zone Melting and Recrystallization Of Si Films On Oxidized Silicon Substrates", Applied Physics Letters, vol. 41, No. 9, 1982, pp. 824–826.

*Primary Examiner*—R. Bruce Breneman
*Assistant Examiner*—Felisa Garrett
*Attorney, Agent, or Firm*—Leydig, Voit & Mayer

[57] ABSTRACT

An apparatus for zone-melting recrystallization of semiconductor films on semiconductor substrates includes a heater disposed opposite the front surface of a semiconductor substrate and moving across the semiconductor substrate at a uniform rate. The heater may be a strip heating element covered with an insulating and refractory material radiating less heat than the strip heating element. Since heat emitted from surfaces of the heating element except the surface opposite the substrate is intercepted by the insulating and refractory film, the width of the molten zone produced in the semiconductor film is reduced.

16 Claims, 24 Drawing Sheets (a)

(b)

Prior Art
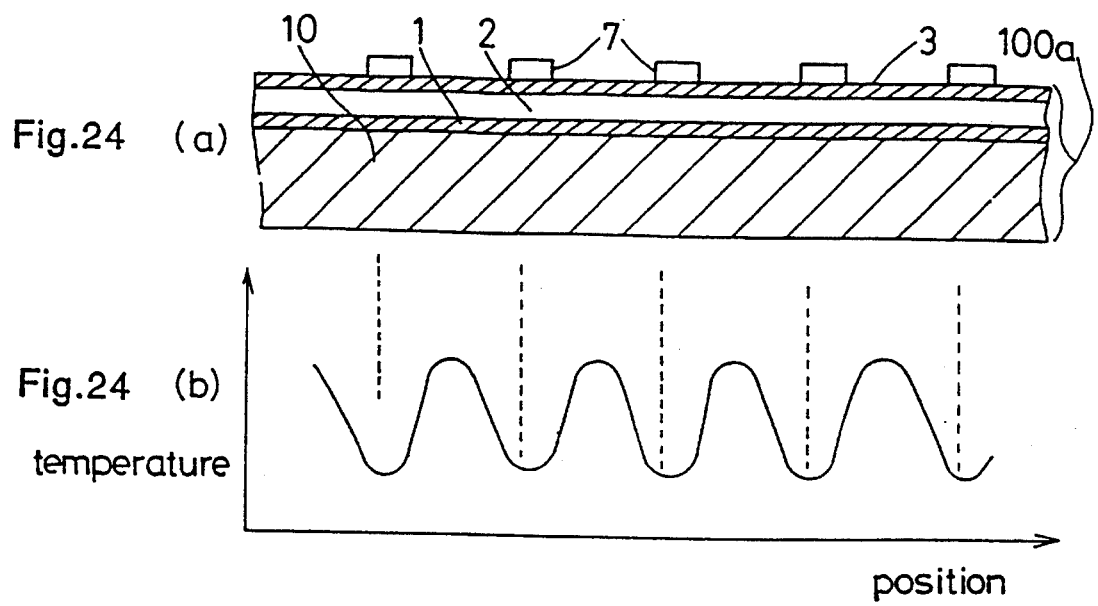
Fig.24 (a)
Fig.24 (b) temperature
Fig.25
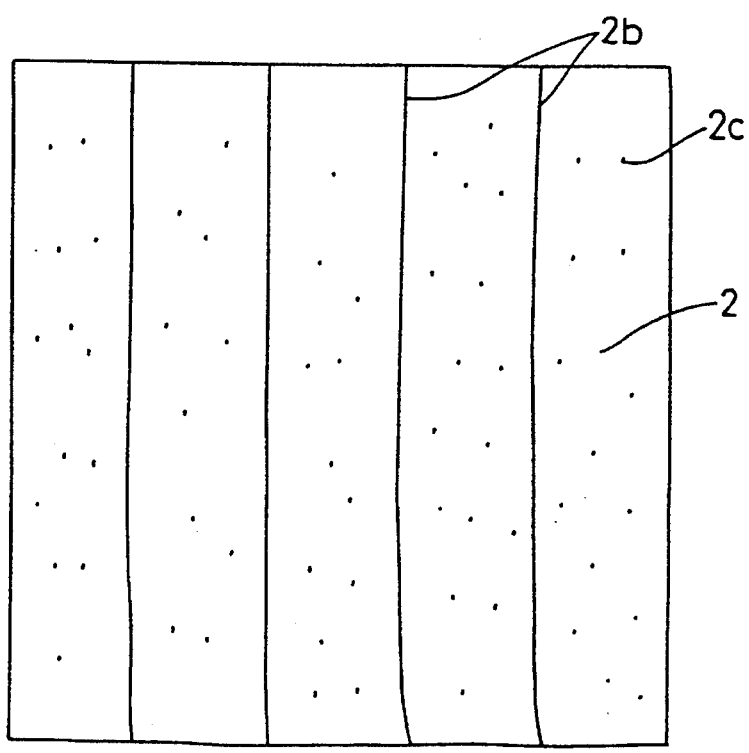

Prior Art
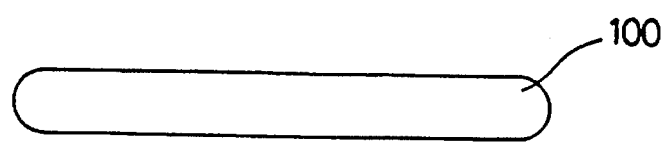
Fig.28 (a)
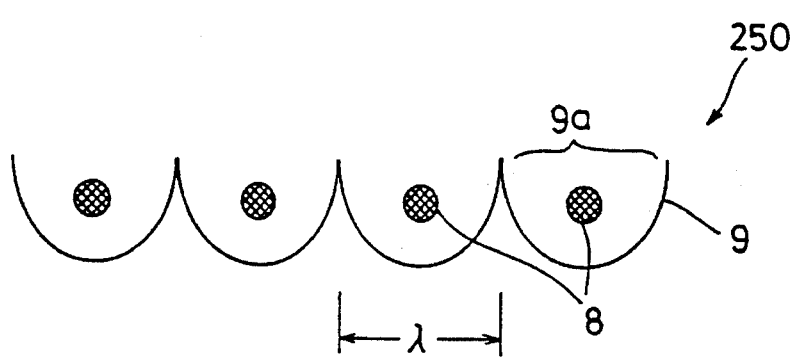
Fig.28 (b)
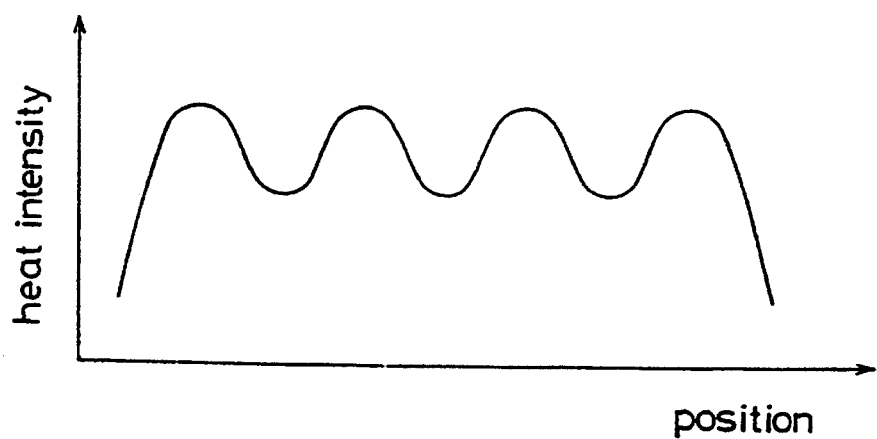

ZONE-MELTING RECRYSTALLIZATION OF SEMICONDUCTOR MATERIALS

FIELD OF THE INVENTION

The present invention relates to methods and apparatus for producing semiconductor substrates and methods for producing semiconductor devices. More particularly, the invention relates to improved techniques for zone-melting recrystallization of a semiconductor film disposed on a substrate.

BACKGROUND OF THE INVENTION

FIGS. 22(a) and 22(b) are a sectional view and a perspective view, respectively, for explaining a prior art method for zone-melting recrystallization of a semiconductor film disposed on a substrate. In the figure, a semiconductor substrate 100 includes an insulating base 10 comprising a ceramic or the like. An $SiO_2$ film 1 about 1 μm thick (hereinafter referred to as a first insulating film) is disposed on the insulating base 10. A semiconductor film 2 0.5~1 μm thick and comprising polycrystalline silicon or amorphous silicon is disposed on the first insulating film 1. A composite film B of $SiO_2$ and $Si_3N_4$ (hereinafter referred to as a third insulating film) is disposed on the semiconductor film 2. The third insulating film 8 is about 1~8 μm thick. An upper carbon strip heater 4 having a width of about 2 mm and a height of about 9 mm is positioned about 1 mm above the semiconductor substrate 100. This upper strip-heater 4 moves across the substrate 100 in a prescribed direction at about 1 mm/s. The substrate 100 is disposed on a susceptor 5, and the susceptor 5 is positioned above a lower heater 6.

A description is given of the zone-melting recrystallization process.

Initially, as illustrated in FIG. 22(b), the semiconductor substrate 100 is placed on the susceptor 5, and the carbon strip heater 4 is moved across the semiconductor substrate 100 at about 1 mm/s, whereby a narrow molten zone 2a is formed in the semiconductor film 2 immediately below the strip 4. The molten zone 2a is resolidified and recrystallized when the strip 4 has passed. In place of the carbon strip heater 4, other strip heaters, such as an infrared ray lamp, may be employed.

FIGS. 23(a) and 23(b) are a sectional view and a plan view, respectively, illustrating a part of the semiconductor substrate 100 after the zone-melting recrystallization process. In the figures, the same reference numerals as in FIGS. 22(a)–22(b) designate the same or corresponding parts. After the zone-melting recrystallization, the grain size of the semiconductor film 2 is increased, whereby electrical characteristics, such as conductivity, are improved. However, as shown in FIGS. 23(a)–23(b), dislocations 2c, subgrain boundaries 2b which are caused by collected dislocations, and other defects occur in the semiconductor film 2. When a device is fabricated using the semiconductor film 2 with the subgrain boundaries 2b and the dislocations 2c, these defects act as recombination centers for carriers (electrons and holes), increasing the dark current of the device. Accordingly, in order to fabricate a device with improved characteristics, it is important to reduce the subgrain boundaries 2b and the dislocations 2c in the semiconductor film 2 or to produce the subgrain boundaries 2b at prescribed positions in the semiconductor film 2 where the subgrain boundaries do not adversely affect the device characteristics. The subgrain boundary 2b is caused by unevenness at a solid-liquid interface, i.e., an interface between the resolidified portion and the molten zone, formed in the semiconductor film 2 during the zone-melting recrystallization process.

FIG. 24(a) shows a cross-section of a semiconductor substrate 100a and FIG. 24(b) shows a temperature distribution in a semiconductor film 2 included in the substrate 100a, for explaining a zone-melting recrystallization method in which subgrain boundaries are produced at desired positions in the semiconductor film. FIG. 25 is a plan view of the semiconductor film 2. In these figures, the same reference numerals as in figures 22(a)–22(b) designate the same or corresponding parts. A plurality of stripe-shaped insulating films 7 are disposed on the insulating film 3 at prescribed intervals. Preferably, the heat insulating films 7 comprise a semiconductor material. The heat insulating films 7 are covered with an insulating film (not shown) as needed.

In this zone-melting recrystallization process, a strip heater, such as a carbon strip heater, is placed above the semiconductor substrate 100a so that the longitudinal direction of the strip heater is perpendicular to the stripe direction of the insulating films 7 and then the heater is moved across the semiconductor substrate 100a in the stripe direction of the insulating films 7 at a uniform rate. Since the stripe-shaped insulating films 7 partially shield the semiconductor substrate 100a from heat emitted from the strip heater, the temperature of portions of the semiconductor film 2 opposite the insulating films 7 is lowered, resulting in the temperature profile shown in FIG. 24(b). Therefore, the unevenness at the solid-liquid interface between the resolidified portion and the molten zone in the semiconductor film 2 is influenced by the temperature profile of FIG. 24(b), so that the subgrain boundaries are concentrated at portions of the semiconductor film 2 opposite the stripe-shaped insulating films 7, i.e., concave portions of the solid-liquid interface, as shown in FIG. 25, whereby monocrystalline regions with few defects are produced between the subgrain boundaries 2b.

However, the formation of the stripe-shaped insulating films 7 complicates the production process. In addition, it is impossible to completely eliminate the subgrain boundaries 2b from the recrystallized semiconductor film.

FIG. 26 is a plan view of a semiconductor substrate for explaining a zone-melting recrystallization method in which a semiconductor film is zone-melted and recrystallized with no subgrain boundary. In the figure, a semiconductor substrate 100b includes a base layer 10. An insulating film 1 is disposed on the base layer 10. A semiconductor film 2A comprising a plurality of island portions 2d and a plurality of line portions 2e connecting the island portions in series is disposed on the insulating film 1. The semiconductor film 2A is covered with an insulating film (not shown).

In this zone-melting recrystallization method, a strip heater, such as a carbon strip heater, is placed above the semiconductor substrate 100b so that the longitudinal direction of the strip heater is perpendicular to the longitudinal direction of the semiconductor film 2A and then the heater is moved across the semiconductor substrate 100b in the longitudinal direction of the semiconductor film 2A at a uniform rate. When a molten zone crosses an island portion 2d of the semiconductor film 2A, heat is transmitted through the line portion 2e which has already been zone-melted and recrystallized, so that the flow of heat in the island portion 2d is concentrated toward the junction between the island portion 2d and the line portion 2e. Therefore, a solid-liquid interface protruding toward the molten zone moving direction is formed in the semiconductor film 2A and the solid-liquid interface has no concave part, whereby no subgrain boundary is produced. In this method, however, when the size of the island portion 2d exceeds a certain extent, the above-described effect which depends on the shape of the semiconductor film 2A is reduced and subgrain boundaries are produced. That is, a large-sized semiconductor film with no subgrain boundary is not produced in this method. Further, since the semiconductor film 2A is formed into the island portions 2d and the line portions 2e, the utilization ratio of the semiconductor film on the substrate is low. This low utilization ratio causes serious problems when a semiconductor device including a large-sized semiconductor film, such as a solar cell, is fabricated.

FIG. 28(a) is a sectional view illustrating a conventional heater used as the lower heater 6 in FIG. 22(a), and FIG. 28(b) illustrates a profile of heat intensity applied to a substrate by the heater. In FIG. 28(a), a heater 250 includes a reflector 9 comprising a plurality of stripe-shaped concave mirrors 9a connected in parallel to each other. The reflector 9 is made of metal and the concave part 9a has an arch-shaped cross section. The internal surfaces of the concave parts 9a are plated with gold. A strip lamp 8 is disposed in the center of each concave part 9a of the reflector 9. A halogen infrared lamp is usually used as the strip lamp 8. The reflector 9 is well cooled with water so that it is not heated by the strip lamps 8. The diameter of the strip lamp 8 is about 1 cm.

Although the reflector 9 is cooled with water, the strip lamp 8 must not be disposed near the reflector 9 because the temperature of the lamp is very high. Therefore, the width $\lambda$ of the aperture of the concave part 9a must be at least several centimeters, so that the interval between adjacent strip lamps 8 is several centimeters.

When the semiconductor substrate 100 is heated by the heater 250, the optical path length of the radiation (heat ray) from the strip lamp 8 directly to the semiconductor substrate 100 is different from the optical path length of the radiation (heat ray) reflected by the reflector 9 before reaching the substrate 100. Further, the radiation reflected by the reflector 9 is weakened in accordance with the reflectance, so that the intensity of heat applied to the semiconductor substrate 100 by the heater 250 is periodically lowered with a period corresponding to the aperture width $\lambda$ of the concave part of the reflector 9 as shown in FIG. 28(b). Accordingly, the heater 250 employed as a lower heater in this zone-melting recrystallization process does not heat the entire surface of the semiconductor substrate 100 with uniform heat intensity, whereby unmelted regions remain in the semiconductor film of the semiconductor substrate 100.

When a semiconductor film is subjected to zone-melting recrystallization, the uniformity of the crystallinity of the recrystallized semiconductor film is improved as the width of the molten zone formed in the semiconductor film is reduced. Therefore, reduction in the width of a carbon strip heater that is conventionally used as an upper heater has been attempted. However, since the carbon strip heater is usually supported by a movable member, if the carbon strip heater is thinner than 2 mm, the heater may be broken when it emits heat and expands.

Likewise, in order to improve the crystallinity of the semiconductor film in the zone-melting recrystallization process, it is desired that the temperature of the molten zone fall gently. FIG. 27 illustrates a temperature distribution in the vicinity of the carbon strip heater 4. If minute control of this temperature distribution is possible, the crystal quality of the semiconductor film is further improved. However, the temperature distribution in the vicinity of the heater 4 is unconditionally determined by the size and sectional form of the heater and the atmosphere surrounding the heater, so that it is impossible to minutely control the temperature distribution.

Furthermore, in the conventional apparatus for zone-melting recrystallization, an advanced machine control technique is required to move the high temperature heating element, i.e., the carbon strip heater, across the semiconductor substrate in a prescribed direction at a uniform rate while maintaining a prescribed distance from the substrate. Therefore, it is difficult to perform that operation with high reliability and repeatability.

As described above, the zone-melting recrystallization methods shown in FIGS. 24(a)–24(b) and 26 can limit the subgrain boundaries within prescribed regions in the semiconductor film or reduce the subgrain boundaries and dislocations in the semiconductor film. However, the formation of the heat insulating films 7 (FIG. 24(a)) or the patterning of the semiconductor film before the zone-melting recrystallization process (FIG. 26) complicates production. In addition, as already described with respect to FIG. 26, there is a limit in the size of a monocrystalline region with no subgrain boundaries produced by the conventional method. Therefore, a large-area monocrystalline semiconductor film with no subgrain boundaries has not yet been released.

Furthermore, the lower heater generally used in the zone-melting recrystallization process cannot heat the target (semiconductor substrate) uniformly because of its structure, so that unmelted portions unfavorably remain in the semiconductor film during the zone melting recrystallization process.

SUMMARY OF THE INVENTION

An object of the present invention is to provide an apparatus for zone-melting recrystallization of semiconductor films that reduces the width of the molten zone produced in the semiconductor film.

Another object of the present invention is to provide an upper heater for zone-melting recrystallization of semiconductor films that moves the molten zone in the semiconductor film at a uniform rate without using advanced machine control techniques.

A further object of the present invention is to provide an upper heater for zone-melting recrystallization of semiconductor films that controls the intensity of the heat applied to the semiconductor film.

Another object of the present invention is to provide an apparatus for zone-melting recrystallization of semiconductor films that realizes a large-area monocrystalline semiconductor film with no subgrain boundaries.

Still another object of the present invention is to provide an apparatus for producing semiconductor substrates including a lower heater that heats the semiconductor substrate uniformly.

Yet another object of the present invention is to provide a method for producing a semiconductor substrate including a large-area monocrystalline semiconductor film with no subgrain boundaries.

A still further object of the present invention is to provide a method for producing an optical semiconductor device using a large-area monocrystalline semiconductor film with no subgrain boundaries as a light responsive region.

Other objects and advantages of the present invention will become apparent from the detailed description given hereianfter; it should be understood, however, that the detailed description and specific embodiment are given by way of illustration only, since various changes and modifications within the spirit and scope of the invention will become apparent to those skilled in the art from this detailed description.

According to a first aspect of the present invention, an apparatus for zone-melting recrystallization of semiconductor films on semiconductor substrates includes a movable strip heating element which is covered with a heat radiation shielding film comprising an insulating and refractory material with less heat radiation except for a surface opposite the semiconductor substrate. Therefore, the width of the molten zone produced in the semiconductor film is reduced.

According to a second aspect of the present invention, an apparatus for zone-melting recrystallization of semiconductor films on semiconductor substrates includes a movable strip heating element and a movable heat radiation shielding member comprising an insulating and refractory material with less heat radiation and shielding from the heating element in all directions other than toward the semiconductor substrate. Therefore, the width of the molten zone produced in the semiconductor film is reduced.

According to a third aspect of the present invention, an apparatus for zone-melting recrystallization of semiconductor films on substrates includes a strip heater comprising a strip body of an insulating and refractory material with less heat radiation and a thin heating film disposed on a surface of the strip body opposite the semiconductor substrate. Therefore, the width of the molten zone produced in the semiconductor film is reduced.

According to a fourth aspect of the present invention, an apparatus for zone-melting recrystallization of semiconductor films on substrates includes a strip heating element, means for moving the strip heating element, and a pair of rollers sandwiching and supporting the strip heating element at opposite ends thereof. In this structure, the thermal expansion of the strip heating element is reduced in the longitudinal direction of the heating element. Therefore, even if a very thin heating element of low strength is employed, it is not bent due to the thermal expansion.

According to a fifth aspect of the present invention, an apparatus for zone-melting recrystallization of semiconductor films on substrates includes a movable strip heating element and a movable plate interposed between the heating element and the semiconductor substrate. The movable plate has a slit narrower than the width of the heating element through which heat emitted from the heating element is applied to the semiconductor substrate. Therefore, the width of the molten zone produced in the semiconductor film is reduced.

According to a sixth aspect of the present invention, an apparatus for zone-melting recrystallization of semiconductor films on substrates includes a heater comprising a plurality of strip heating elements connected in parallel to each other via insulating films. A voltage supply time for each heating element is controlled to move the heated region, i.e., the molten zone, in the semiconductor film. Therefore, the semiconductor film is zone-melted and recrystallized with higher reliability and reproducibility compared with the conventional strip heater which moves across the semiconductor substrate.

According to a seventh aspect of the present invention, the above-described heater further includes means for varying a heating region of each strip heating element. Therefore, the shape of the solid-liquid interface in the semiconductor film can be changed by selectively applying heat to uneven portions of the solid-liquid interface, whereby subgrain boundaries which are about to occur during the zone-melting recrystallization are avoided.

According to an eighth aspect of the present invention, an apparatus for zone-melting recrystallization of semiconductor films on semiconductor substrates includes a strip heating element and a heat intensity control member interposed between the heating element and the semiconductor substrate. The heat intensity control member periodically varies the intensity of heat emitted from the strip heating element and applied to the semiconductor substrate. Therefore, the semiconductor film is zone-melted and recrystallized while controlling the position of the subgrain boundary with no particular work on the semiconductor substrate.

According to a ninth aspect of the present invention, an apparatus for producing a semiconductor substrate includes a heater comprising a plurality of strip lamps arranged parallel to each other at prescribed intervals, and a light scattering means interposed between the heater and the semiconductor substrate. Therefore, the radiation from the strip lamp is scattered in all directions, whereby the entire surface of the semiconductor substrate is uniformly heated.

According to a tenth aspect of the present invention, in a method for producing a semiconductor substrate, initially, a plurality of first semiconductor films, each semiconductor film including island portions and line portions connecting the island portions in series, are formed on an insulating substrate so that the island portions of one semiconductor film are adjacent to the island portions of another semiconductor film. After covering the first semiconductor films with a first insulating film, a plurality of second semiconductor films having the same structure as the first semiconductor films are formed on the first insulating film so that the island portions of the second semiconductor films are not overlapped with the island portions of the first semiconductor films. After covering the second semiconductor films with a second insulating film, the first and second semiconductor films are subjected to zone-melting recrystallization. Therefore, a monocrystalline semiconductor film with few crystalline defects is produced over the entire surface of the semiconductor substrate.

According to an eleventh aspect of the present invention, a dopant impurity producing a conductivity type opposite to the conductivity type of the first and second semiconductor films is diffused into the island portions of the first and second semiconductor films after the zone-melting recrystallization to form pn junctions. Thereafter, the island portions of the first (second) semiconductor films are connected to the line portions of the adjacent second (first) semiconductor films by metal electrodes. Therefore, an integrated solar cell including a plurality of island-shaped monocrystalline semiconductor films serving as light responsive parts is achieved.

BRIEF DESCRIPTION OF THE DRAWINGS

FIG. 24(a) is a sectional view of a semiconductor substrate including a semiconductor film employed in a zone-melting recrystallization process according to the prior art, and FIG. 24(b) illustrates a temperature distribution produced in the semiconductor substrate.

FIG. 25 is a plan view illustrating an internal state of the semiconductor film shown in FIG. 24(a) after the zone-melting recrystallization process.

FIG. 28(a) is a sectional view illustrating a lower heater included in an apparatus for producing semiconductor substrates according to the prior art, and FIG. 28(b) illustrates a profile of heat intensity applied to the semiconductor substrate.

DETAILED DESCRIPTION OF THE PREFERRED EMBODIMENTS

Figure 1:
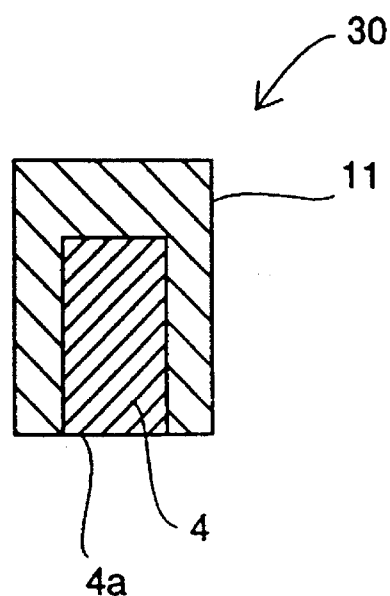
FIG. 1 is a sectional view illustrating an upper heater included in an apparatus for zone-melting recrystallization of semiconductor films in accordance with a first embodiment of the present invention.
Figure 22:
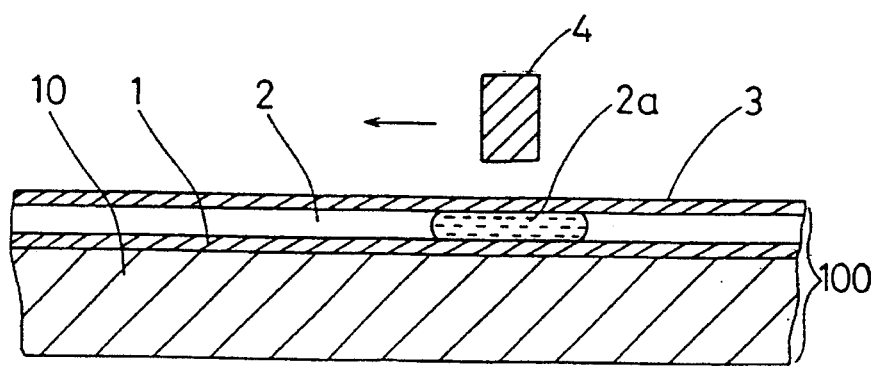
FIGS. 22(a) and 22(b) are a sectional view and a perspective view, respectively, for explaining a method for zone-melting recrystallization of a semiconductor film on a substrate, according to the prior art.
Figure 22:
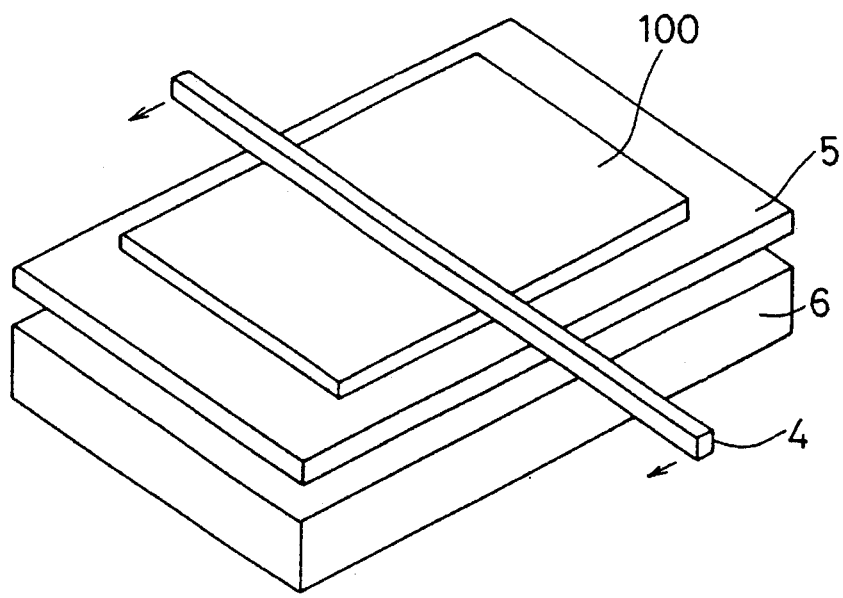
Figure 23:
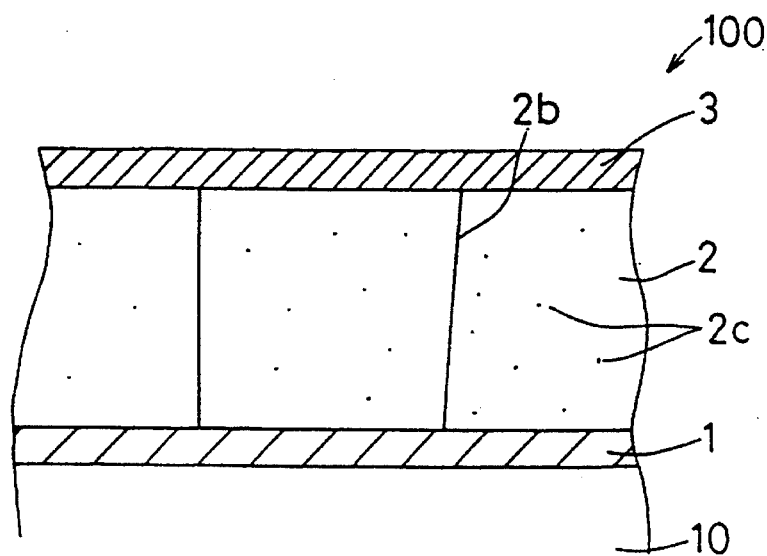
FIGS. 23(a) and 23(b) are a sectional view and a plan view, respectively, illustrating an internal state of the semiconductor film after the zone-melting recrystallization process shown in FIGS. 22(a)–22(b).
Figure 23:
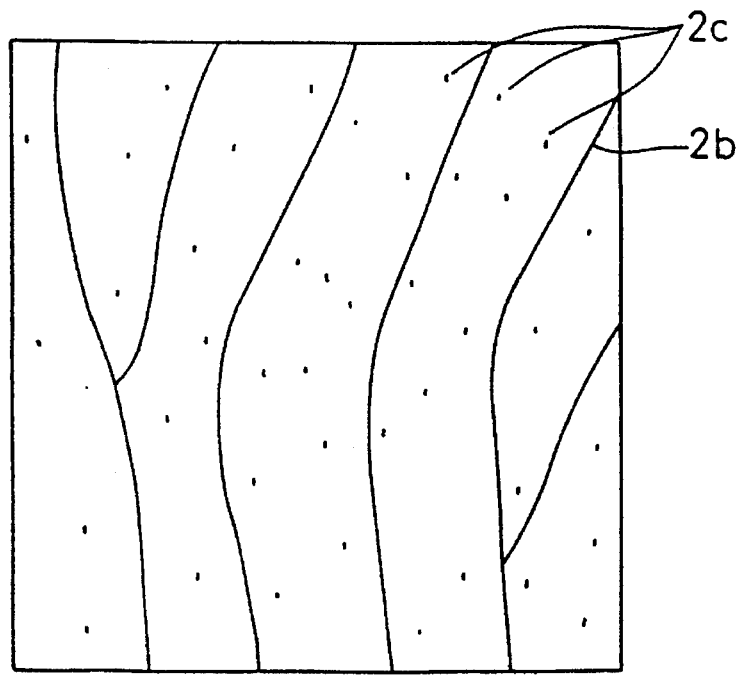

FIG. 1 is a sectional view illustrating an upper heater included in an apparatus for zone-melting recrystallization of semiconductor films in accordance with a first embodiment of the present invention. In FIG. 1, an upper heater 30 includes a carbon strip heater 4 having a width of 9 mm and a height of 9 mm and a heat radiation suppressing film 11 which covers the carbon strip heater 4 except a surface 4a opposite a target to be heated (not shown), such as a semiconductor substrate. The heat radiation shielding film 11 comprises an insulating and refractory material with less heat radiation, such as boron nitride (BN). The heat radiation shielding film 11 is formed by molding leaving a space for containing the carbon strip heater 4. Alternatively, it may be deposited over the carbon strip heater 4 except the surface 4a by chemical vapor deposition (CVD). The whole structure of this zone-melting recrystallization apparatus is identical to that shown in FIG. 22(b) except that the carbon strip heater 4 of FIG. 22(b) is replaced with the heater 30 of FIG. 1. This upper heater 30 is positioned at a prescribed distance from the surface of the semiconductor substrate 100 and moved across the substrate at a uniform rate.

In the apparatus according to this first embodiment, since the heat radiation from the carbon strip heater 4 except the surface 4a opposite the semiconductor substrate 100 is suppressed by the heat radiation suppressing film 11, the high temperature region, i.e., the molten zone, in the semiconductor film 2 opposite the strip heater 4 is narrower than that of the prior art, whereby the semiconductor film 2 is minutely zone-melted and recrystallized, improving the crystal quality of the semiconductor film 2.

Figure 2:
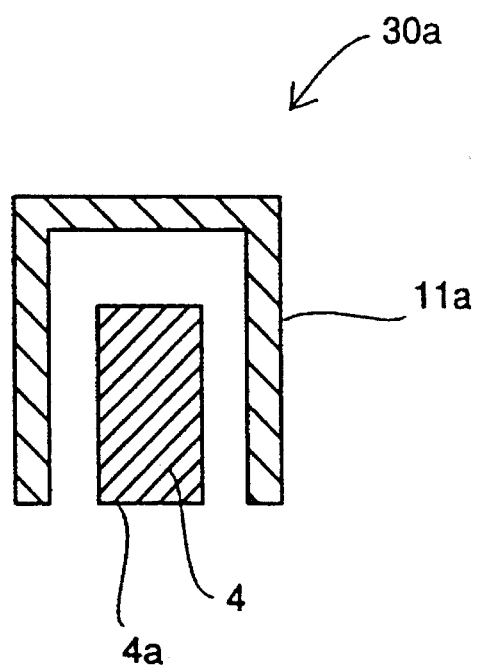
FIG. 2 is a sectional view illustrating an upper heater included in an apparatus for zone-melting recrystallization of semiconductor films in accordance with a second embodiment of the present invention.

FIG. 2 is a sectional view illustrating an upper heater included in an apparatus for zone-melting recrystallization of semiconductor films in accordance with a second embodiment of the present invention. In FIG. 2, an upper heater 30a comprises a carbon strip heater 4 having a width of 9 mm and a height of 9 mm and a movable heat radiation suppressing member 11a surrounding the carbon strip heater 4 except a surface 4a opposite a target to be heated, such as a semiconductor substrate. The heat radiation suppressing member 11a prevents heat emitted from the carbon strip heater 4 except the surface 4a from radiating in all directions. Preferably, the heat radiation suppressing member 11a comprises boron nitride. The whole structure of this zone-melting recrystallization apparatus is identical to that shown in FIG. 22(b) except that the carbon strip heater 4 of FIG. 22(b) is replaced with the heater 30a of FIG. 2. The heater 30a is positioned at a prescribed distance from the surface of the semiconductor substrate 100 and moved across the substrate at a uniform rate.

In the apparatus according to this second embodiment, since the heat radiation shielding member 11a prevents heat emitted from the carbon strip heater 4 except the surface 4a opposite the semiconductor substrate 100 from radiating in all directions, the same effects as the first embodiment are achieved.

In the above-described first embodiment, since the heat radiation shielding film 11 is in contact with the carbon strip heater 4, the film 11 is directly heated by the heater 4 and the temperature of the film 11 is increased, resulting in a possibility of the film 11 radiating heat. In this second embodiment, since the heat radiation shielding member 11a is not directly heated by the carbon strip heater 4, the heat radiation shielding effect is further improved.

While in the above-described second embodiment a carbon strip heater is employed as a linear heating element, a linear infrared lamp may be employed in place of the carbon strip heater.

Figure 3:
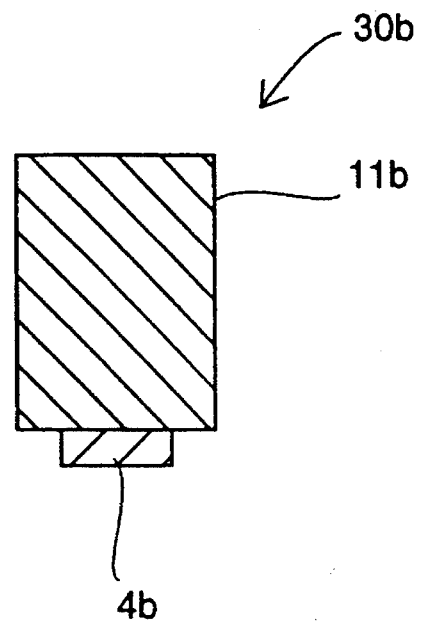
FIG. 3 is a sectional view illustrating an upper heater included in an apparatus for zone-melting recrystallization of semiconductor films in accordance with a third embodiment of the present invention.

FIG. 3 is a sectional view illustrating an upper heater included in an apparatus for zone-melting recrystallization of semiconductor films in accordance with a third embodiment of the present invention. In FIG. 3, an upper heater 30b includes a strip base 11b having a width of 2 mm and a height of 5 mm or more. A thin heating layer 4b comprising carbon or the like and having a width of about 1 mm and a thickness of 100~200 μm is disposed on a surface of the strip base 11b opposite a target to be heated, such as a semiconductor substrate. In production, the strip base 11b is formed by molding boron nitride or the like, and the heating layer 4b is deposited on a prescribed surface of the base 11b by CVD. The heating layer 4b generates heat when a voltage is applied thereto. The whole structure of this zone-melting recrystallization apparatus is fundamentally identical to that shown in FIG. 22(b) except that the carbon strip heater 4 of FIG. 22(b) is replaced with the upper heater 30b of FIG. 3. The upper heater 30b is positioned at a prescribed distance from the surface of the semiconductor substrate 100 and moved across the substrate in a prescribed direction at a uniform rate.

In the apparatus according to this third embodiment, since the heating layer 4b is as thin as 100~200 μm, heat emitted from the side surfaces of the heating layer 4b does not spread in all directions, so that the semiconductor substrate is heated by heat emitted from a surface of the heating layer 4b opposite the substrate, resulting in a molten zone narrower than that of the prior art. As described above, a carbon strip heater having a width of less than 2 mm is of no practical use because of its poor mechanical strength. However, since the upper heater 30b of this third embodiment includes the strip base 11b formed by molding an insulating and refractory material, such as boron nitride, the strength of the heater 30b is reliable.

Figure 4:
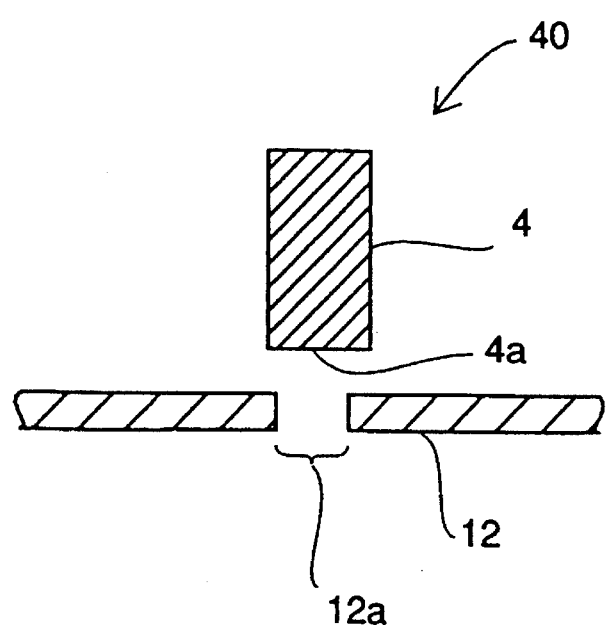
FIG. 4 is a sectional view illustrating an upper heater included in an apparatus for zone-melting recrystallization of semiconductor films in accordance with a fourth embodiment of the present invention.

FIG. 4 is a sectional view illustrating an upper heater included in an apparatus for zone-melting recrystallization of semiconductor films in accordance with a fourth embodiment of the present invention. In FIG. 4, an upper heater 40 comprises a carbon strip heater 4 and a movable heat shielding plate 12 comprising a refractory material, such as tungsten (W), and having a slit 12a opposite a surface 4a of the strip heater 4. The width of the slit 12a is narrower than the width of the strip heater 4. The whole structure of this zone-melting recrystallization apparatus is identical to that shown in FIG. 22(b) except that the heat shielding plate 12 is interposed between the heater 4 and the semiconductor substrate 100. The upper heater 40 is positioned at a prescribed distance from the surface of the semiconductor substrate 100 and moved across the substrate in a prescribed direction at a uniform rate.

According to the fourth embodiment of the present invention, since heat emitted from the carbon strip heater 4 reaches the semiconductor substrate through the slit 12a of the heat shielding plate 12 and the width of the slit 12a is narrower than the width of the heater 4, a molten zone narrower than that of the prior art is produced in the semiconductor film 2, resulting in the same effects as in the first embodiment.

Also in this fourth embodiment, a linear infrared lamp may be employed in place of the carbon strip heater 4.

Figure 5:
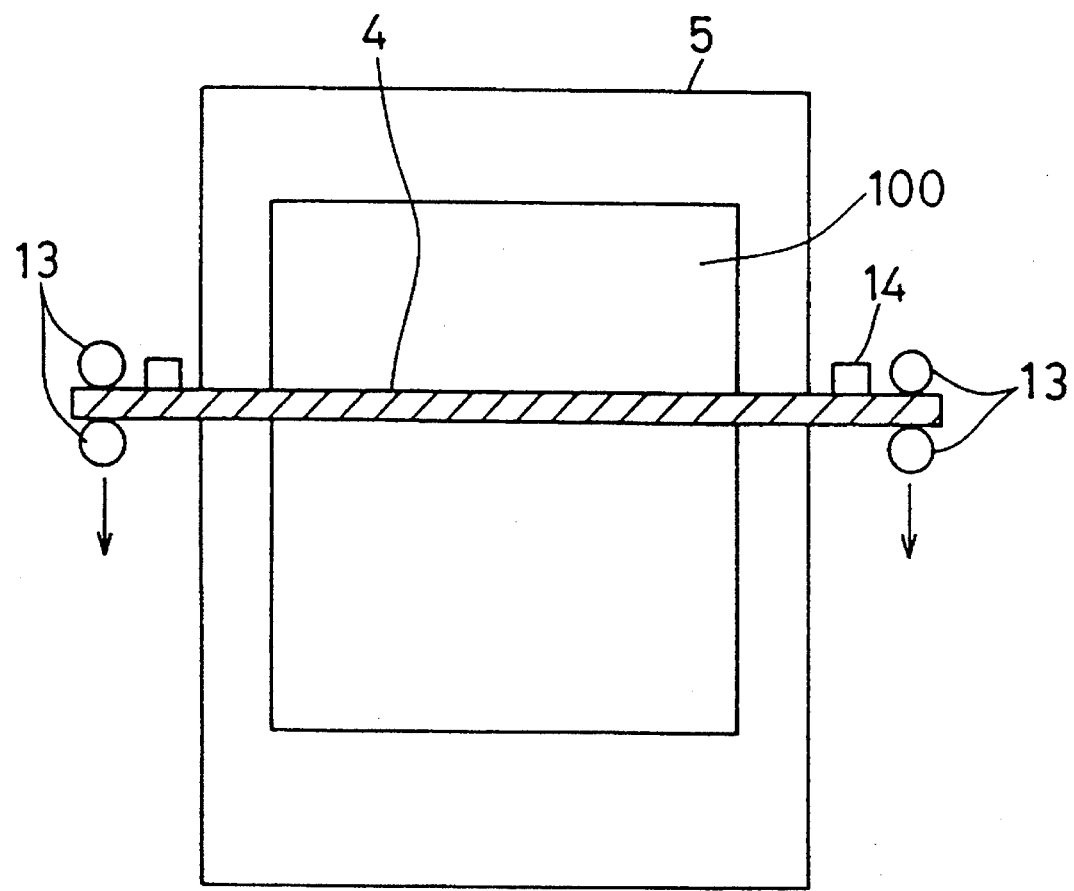
FIG. 5 is a plan view illustrating an apparatus for zone-melting recrystallization of semiconductor films in accordance with a fifth embodiment of the present invention.

FIG. 5 is a plan view of an apparatus for zone-melting recrystallization of semiconductor films in accordance with a fifth embodiment of the present invention. In the figure, the same reference numerals as in FIG. 22(b) designate the same or corresponding parts. In this apparatus, a carbon strip heater 4 is sandwiched and supported by a pair of movable stainless rollers 13 at the opposite ends. These rollers 13 are connected to a movable mechanism for driving the heater 4 (not shown). Reference numeral 14 designates copper electrodes for applying current to the carbon strip heater 4. The copper electrodes are cooled by a water-cooling system (not shown). The carbon strip heater 4 is positioned at a prescribed distance from the surface of the semiconductor substrate 100 and moved across the substrate 100 in a prescribed direction at a uniform rate.

In the apparatus according to this fifth embodiment, when the carbon strip heater 4 generates heat and expands, the stainless rollers 13 relieve the expansion in the longitudinal direction of the heater 4. Therefore, even if the width of the carbon strip heater 4 is less than 2 mm, the heater maintains its strength and is not broken. Accordingly, a carbon strip heater narrower than 2 mm, for example, a 1 mm wide heater, can be employed, whereby a molten zone narrower than that of the prior art is produced in the semiconductor film, resulting in the same effects as in the above-described first embodiment.

Figure 6:
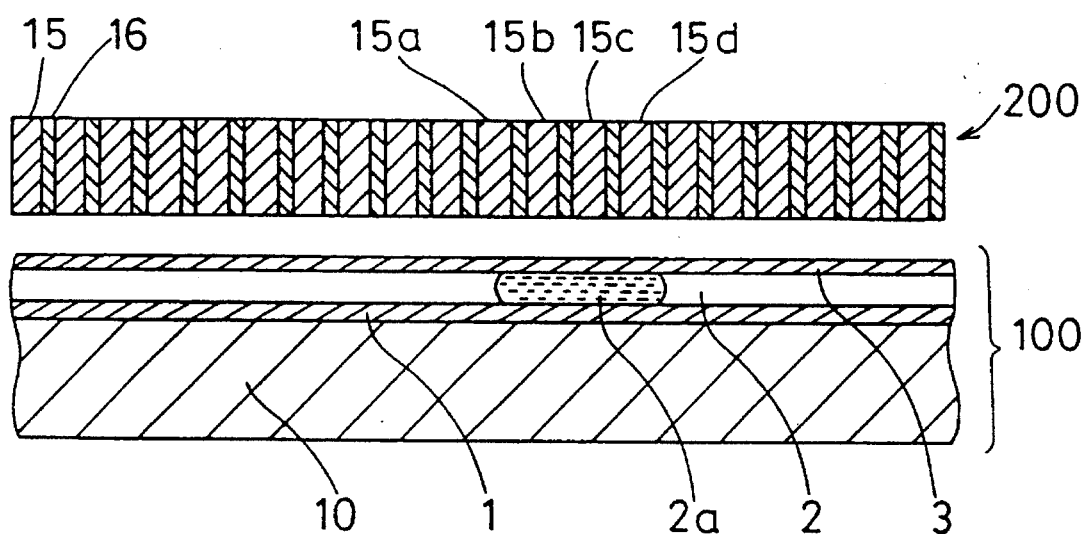
FIG. 6 is a sectional view illustrating an upper heater included in an apparatus for zone-melting recrystallization of semiconductor films in accordance with a sixth embodiment of the present invention.
Figure 7:
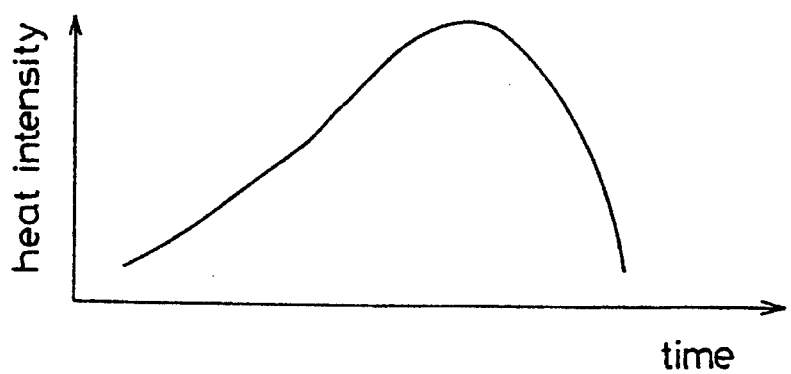
FIGS. 7(a)–7(d) are graphs illustrating a transition of heat intensity applied to a semiconductor substrate by the upper heater shown in FIG. 6.
Figure 7:
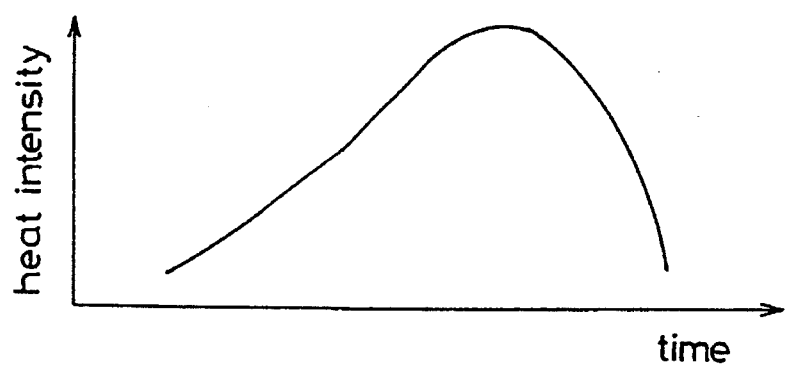
Figure 7:
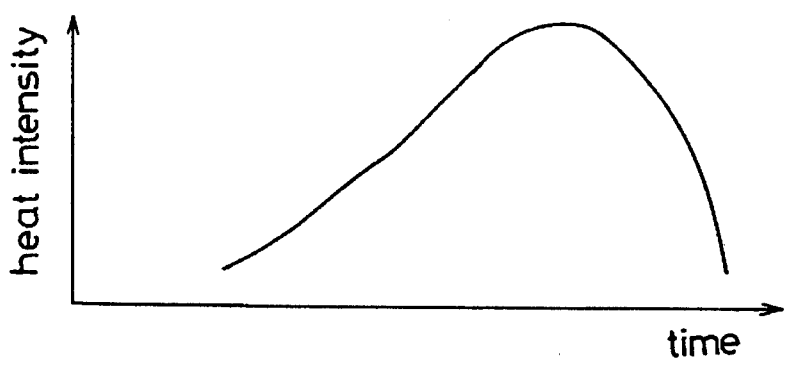
Figure 7:

FIG. 6 is a sectional view illustrating an upper heater included in an apparatus for zone-melting recrystallization of semiconductor films in accordance with a sixth embodiment of the present invention. In FIG. 6, the same reference numerals as in FIG. 22(a) designate the same or corresponding parts. An upper heater 200 of this sixth embodiment comprises a plurality of strip heating elements 15 which are mechanically connected in parallel to each other via intervening insulating films 16. The upper heater 200 is positioned about 1 mm above the semiconductor substrate 100 and covers the entire surface of the substrate 100. Each heating element 15 has a width of about 0.5 mm and comprises a carbon strip that generates heat when a voltage is applied. The turning-on time, i.e., heating time, of each heating element 15 is controlled by a control device (not shown). The insulating films 16 are formed by coating the side surface of the heating element with boron nitride (BN). In the figure, reference numerals 15a to 15d designate specified heating elements for explaining the operation of this apparatus. FIGS. 7(a) to 7(d) illustrate heat intensity vs. heating time characteristics of the heating elements 15a to 15d, respectively.

A description is given of the operation.

The heating elements 15 are successively turned on in the array direction by staggering the turning-on times of the heating elements 15. For example, if the turning-on times of the heating elements 15a, 15b, 15c, and 15d are staggered in this order as shown in FIGS. 7(a) to 7(d), the highest temperature region in the semiconductor substrate 100 moves according to the timewise change of the heat intensity of each heating element applied to the semiconductor substrate, whereby the molten zone 2a moves in the semiconductor film 2. In this way, zone-melting recrystallization of the semiconductor film 2 is carried out.

In this apparatus, the upper heater 200 is fixed at a prescribed position above the semiconductor substrate 100, and the zone-melting recrystallization of the semiconductor film 2 is carried out utilizing the timewise change of the heat intensity of each heating element 15. Therefore, the zone-melting recrystallization process is carried out with high reliability and reproducibility, without the mechanical difficulty of moving a high temperature carbon strip heater in a prescribed direction at a uniform rate while maintaining a prescribed distance from the semiconductor substrate.

Figure 8:
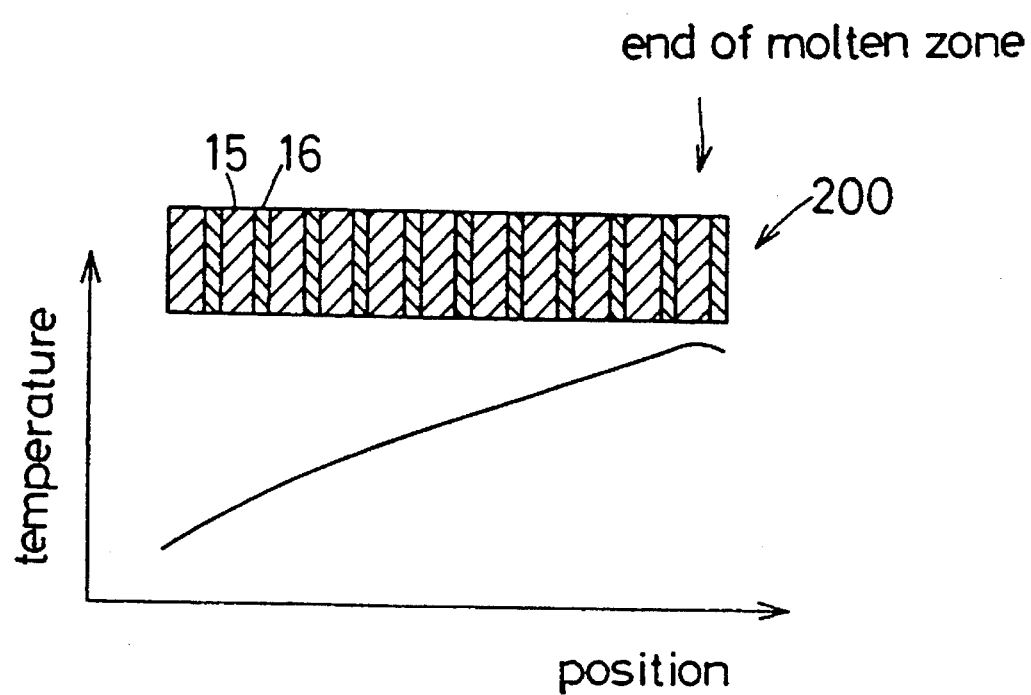
FIG. 8 is a diagram illustrating a temperature distribution produced beneath the upper heater shown in FIG. 6.
Figure 27:
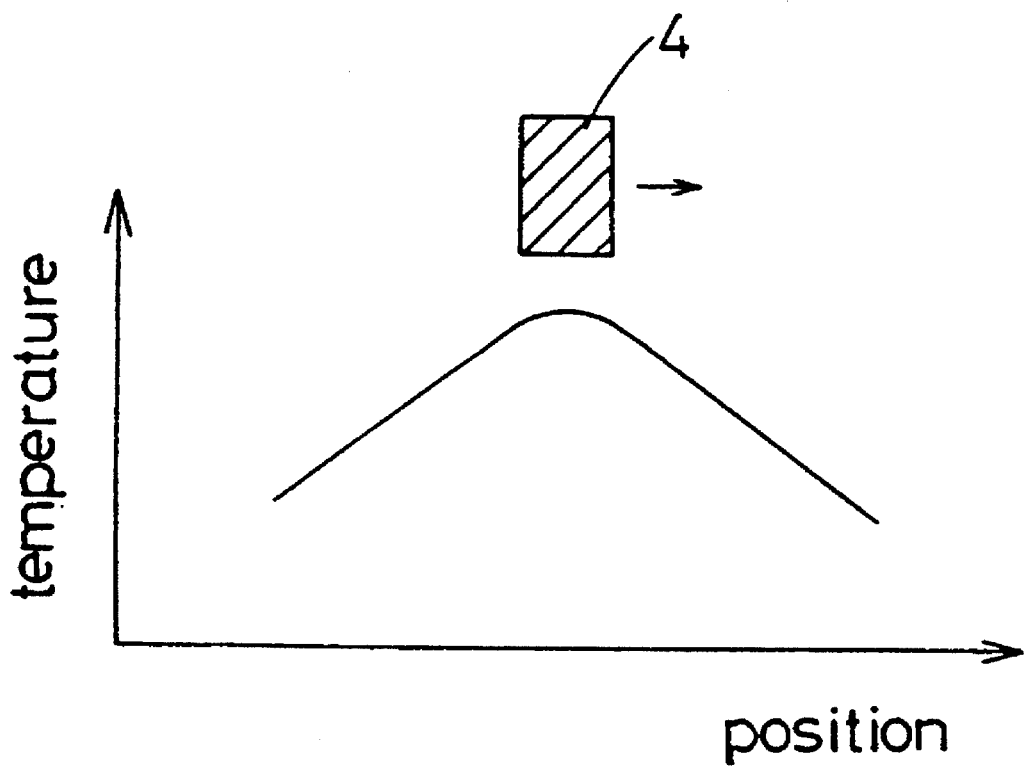
FIG. 27 is a diagram illustrating a temperature distribution produced beneath a movable carbon strip heater according to the prior art.

FIG. 27 illustrates a temperature gradient produced under a conventional movable carbon strip heater 4. FIG. 8 illustrates a temperature gradient produced under the upper heater 200 employed in this sixth embodiment of the present invention. The temperature gradient under the conventional heater 4 is relatively steep as shown in FIG. 27. On the other hand, in this sixth embodiment of the present invention, since the temperature gradient under the heater 200 can be varied by controlling the heat intensity of each heating element 15 included in the heater 200, a relatively gentle gradient is achieved as shown in FIG. 8. Accordingly, in this apparatus, it is possible to gradually decrease the temperature of the molten zone 2a in the semiconductor film 2 after the zone-melting, whereby the crystalline quality of the recrystallized semiconductor film is improved.

Figure 9:
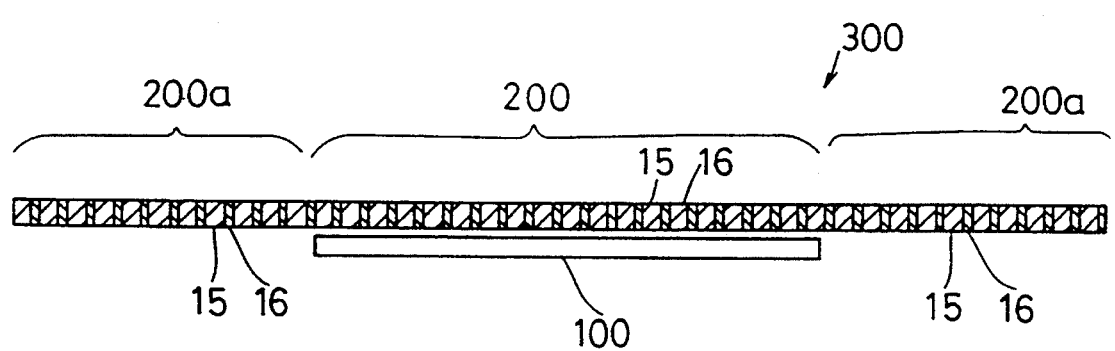
FIG. 9 is a sectional view illustrating an upper heater included in an apparatus for zone-melting recrystallization of semiconductor films in accordance with a seventh embodiment of the present invention.

FIG. 9 is a sectional view illustrating an upper heater included in an apparatus for zone-melting recrystallization of semiconductor films in accordance with a seventh embodiment of the present invention. In FIG. 9, the same reference numerals as in FIG. 6 designate the same or corresponding parts. In this seventh embodiment, additional heaters 200a are attached to both ends of the heater 200 shown in FIG. 6 to obtain a heater 300 larger than the semiconductor substrate 100.

In the above-described sixth embodiment, since the upper heater 200 is as large as the semiconductor substrate 100, the heat intensity applied to the end of the semiconductor substrate 100 is lower than the heat intensity applied to the center of the substrate, resulting in a difference in crystal qualities between the end part and the center part of the substrate. In this seventh embodiment, since the upper heater 300 is larger than the semiconductor substrate 100, the uniformity of the crystalline quality in the recrystallized semiconductor film is improved.

Figure 10:
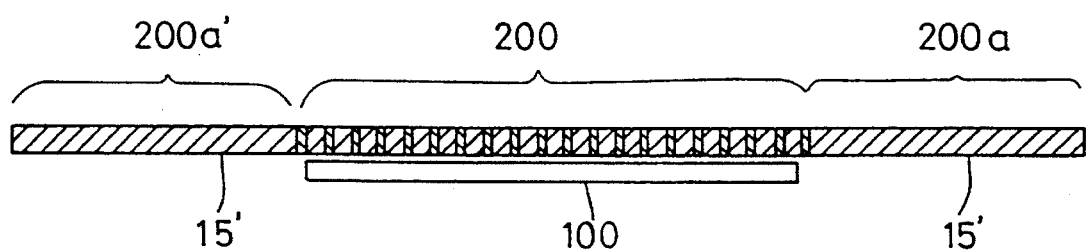
FIG. 10 is a sectional view illustrating a variation of the upper heater shown in FIG. 9.

While in this seventh embodiment the additional heater 200a has the same structure as the heater 200, it may be a carbon heater 15' as shown in FIG. 10. Also in this case the same effect as described above is achieved.

Figure 11:
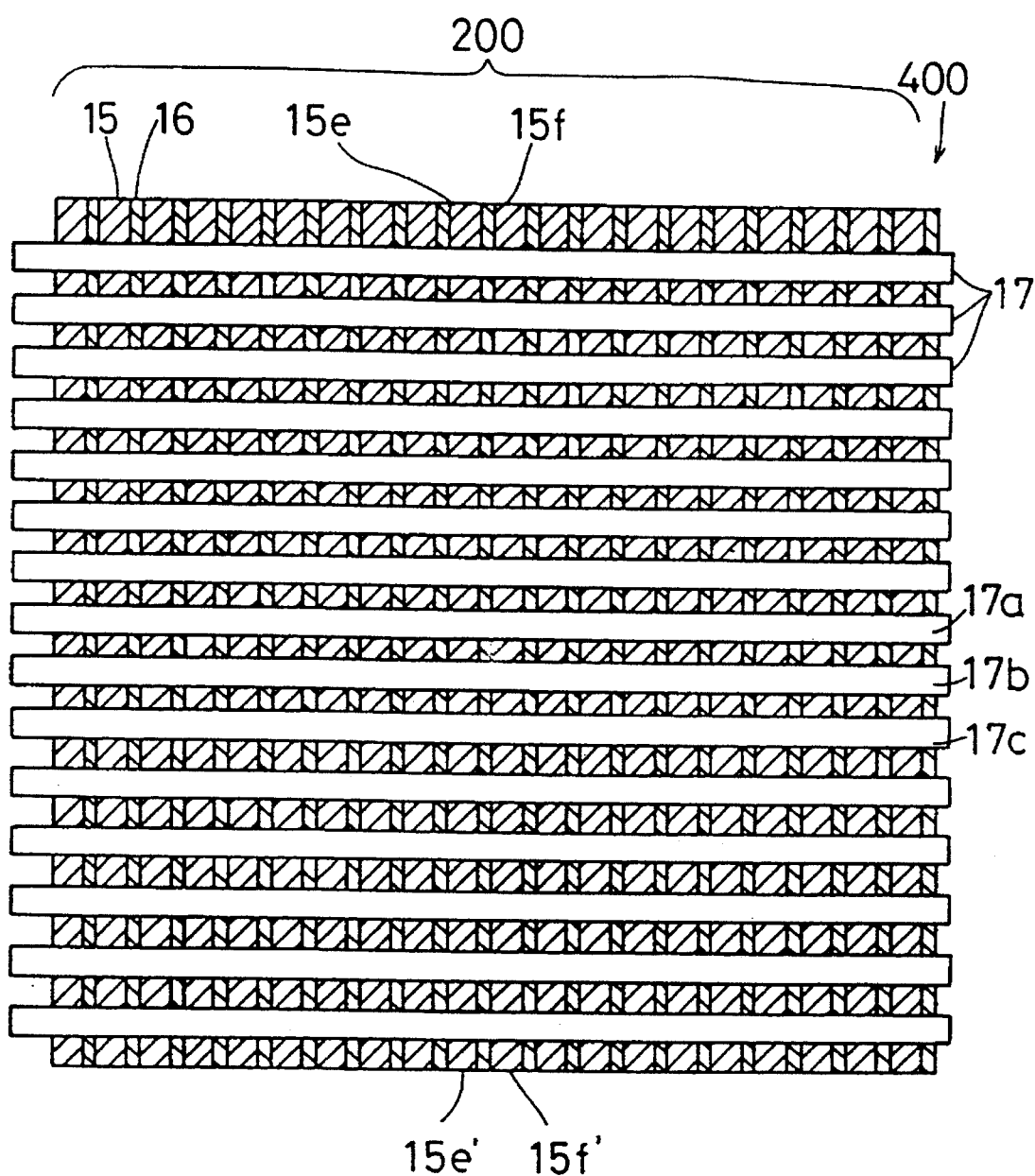
FIG. 11 is a sectional view illustrating an upper heater included in an apparatus for zone-melting recrystallization of semiconductor films in accordance with an eighth embodiment of the present invention.

FIG. 11 is a plan view illustrating an upper heater included in an apparatus for zone-melting recrystallization of semiconductor films in accordance with an eighth embodiment of the present invention. In the figure, the same reference numerals as in FIG. 6 designate the same or corresponding parts. In this eighth embodiment, a plurality of strip electrode elements 17 are disposed on the heater 200, parallel to each other at equally spaced intervals, perpendicular to the heating elements 15. Preferably, each electrode element 17 comprises carbon. The sectional area of the electrode element 17 is larger than that of the heating element 15 to reduce the electrical resistance. The heating element 15 and the electrode element 17 are electrically connected to each other at their intersections.

A description is given of the operation.

In the above-described sixth embodiment, voltage is applied to the opposite ends of each heating element 15 of the upper heater 200 so that the whole length of the heating element 15 generates heat. In the upper heater 400 of this eighth embodiment, the heating region of each heating element 15 can be varied timewise with the electrode elements 17. More specifically, in FIG. 11, initially voltage is applied to the opposite ends of the heating element 15e so that the whole length of the element 15e emits heat and, a little later, voltage is applied to the opposite ends of the heating element 15f so that the whole length of the element 15f emits heat. Thereafter, voltage is applied to an end 15e' of the heating element 15e and the electrode element 17a and, a little later, voltage is applied to an end 15f' of the heating element 15f and the electrode element 17a. Thereafter, the electrode element to which voltage is applied is successively selected as 17b, 17c, . . . , whereby the heating regions of the heating elements 15e and 15f are successively reduced.

In the apparatus according to this eighth embodiment of the present invention, the heating elements 15 successively generate heat in the array direction to move the molten zone in the semiconductor film and, at the same time, the heating region of the heating element opposite a region of the semiconductor film after the zone-melting process is selectively varied to change the shape of the solid-liquid interface in the semiconductor film, whereby subgrain boundaries which are about to occur during the recrystallization process are avoided. Therefore, the zone-melting recrystallization is carried out with no subgrain boundaries.

Since a specified region of each heating element 15 is heated by applying voltage to two specified electrode elements 17, if the combination of these two electrode elements to which voltage is applied is successively changed, zone-melting recrystallization of the semiconductor film in the array direction of the electrode elements 17 is possible. More specifically, after the zone-melting recrystallization of the semiconductor film in the array direction of the heating elements 15 (first zone-melting recrystallization process), the heating region of each heating element 15 is moved in the array direction of the electrode elements 17 by successively shifting the combination of two electrode elements 17 to which voltage is applied (second zone-melting recrystallization process). In this way, crystals which extend in the moving direction of the molten zone in the first zone-melting recrystallization process are used as growth seeds in the second zone-melting recrystallization process, whereby a semiconductor film with a large-area monocrystalline region is achieved.

Figure 12:
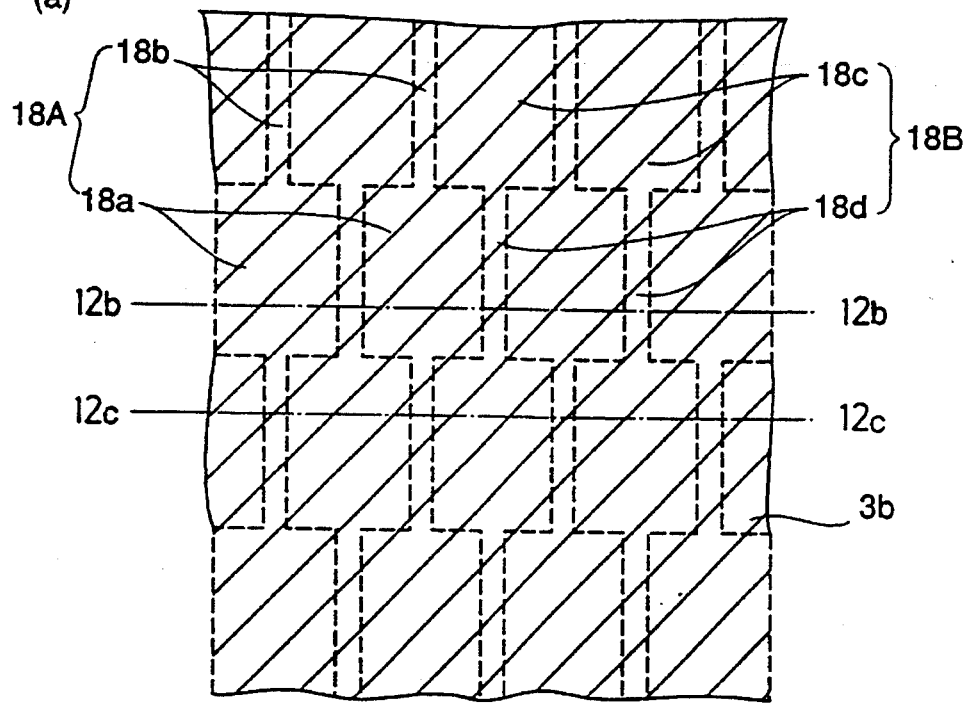
FIG. 12(a) is a plan view for explaining production of a solar cell in accordance with a ninth embodiment of the present invention.
FIGS. 12(b) and 12(c) are sectional views taken along lines 12b—12b and 12c—12c of FIG. 12(a), respectively.
Figure 12:
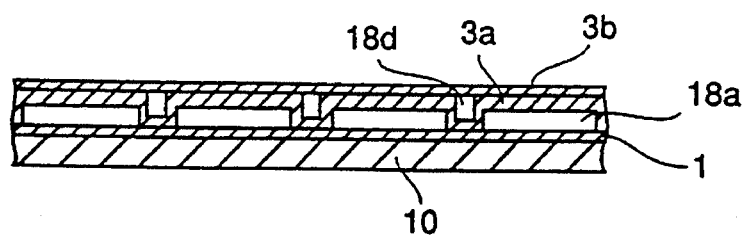
Figure 12:
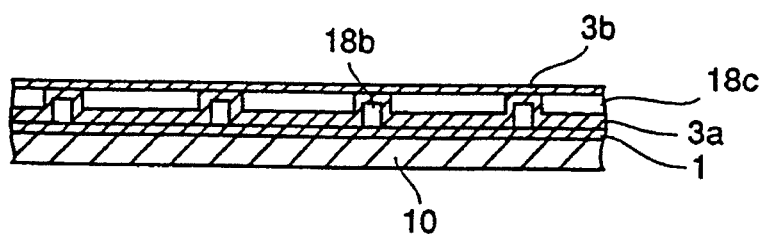
Figure 13:
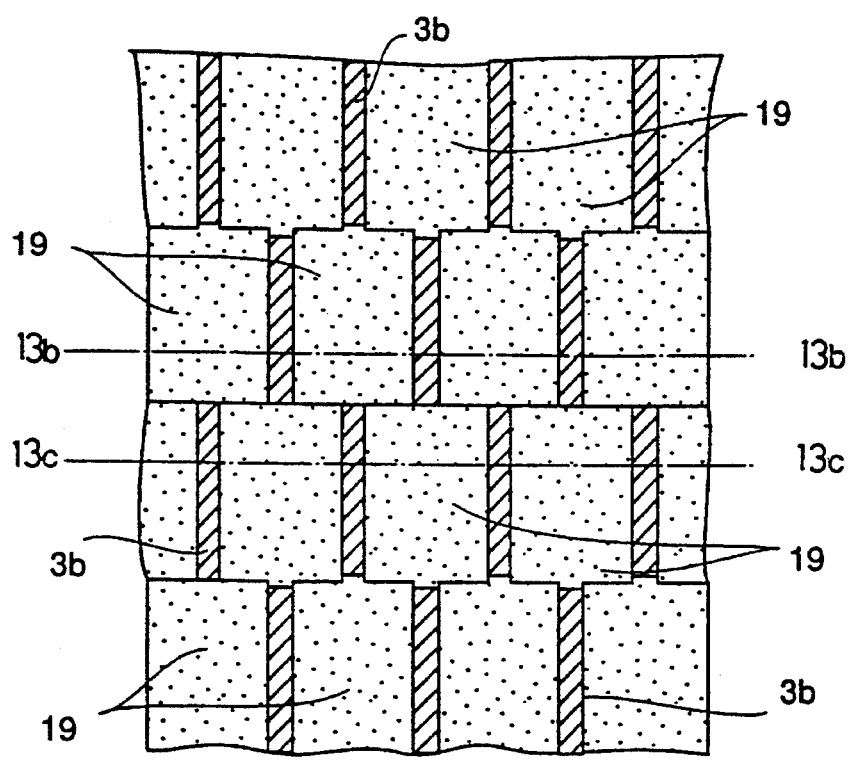
FIG. 13(a) is a plan view for explaining the production of a solar cell in accordance with the ninth embodiment of the present invention.
FIGS. 13(b) and 13(c) are sectional views taken along lines 13b—13b and 13c—13c of FIG. 13(a), respectively.
Figure 13:
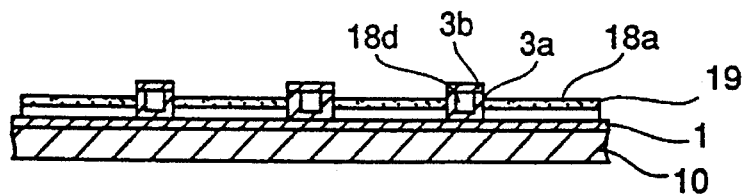
Figure 13:
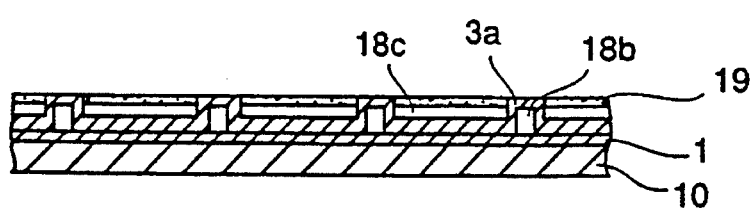
Figure 14:
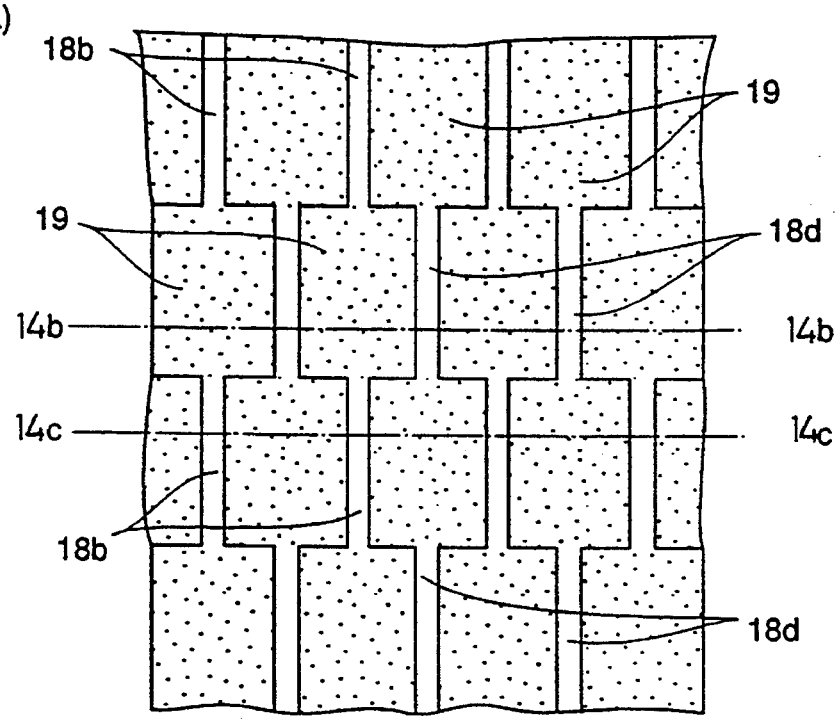
FIG. 14(a) is a plan view for explaining the production of a solar cell in accordance with the ninth embodiment of the present invention.
FIGS. 14(b) and 14(c) are sectional views taken along lines 14b–14b and 14c—14c of FIG. 14(a), respectively.
Figure 14:
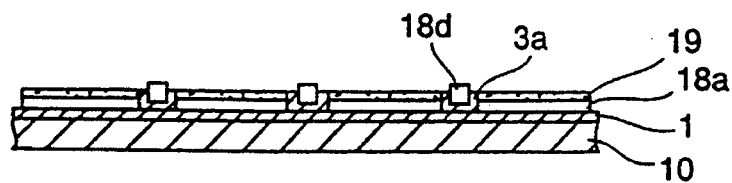
Figure 14:
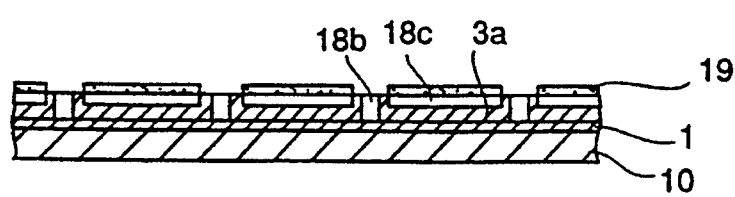

FIGS. 12(a)–12(c), 13(a)–13(c), and 14(a)–14(c) illustrate process steps for producing a solar cell in accordance with a ninth embodiment of the present invention. FIG. 12(a) is a plan view illustrating a first step of the process, and FIGS. 12(b) and 12(c) are sectional views taken along lines 12b—12b and 12c—12c of FIG. 12(a), respectively. FIG. 13(a) is a plan view illustrating a second step of the process, and FIGS. 13(b) and 13(c) are sectional views taken along lines 13b—13b and 13c—13c of FIG. 13(a), respectively. FIG. 14(a) is a plan view illustrating a third step of the process, and FIGS. 14(b) and 14(c) are sectional views taken along lines 14b—14b and 14c—14c of FIG. 14(a).

A description is given of the production process.

Figure 26:
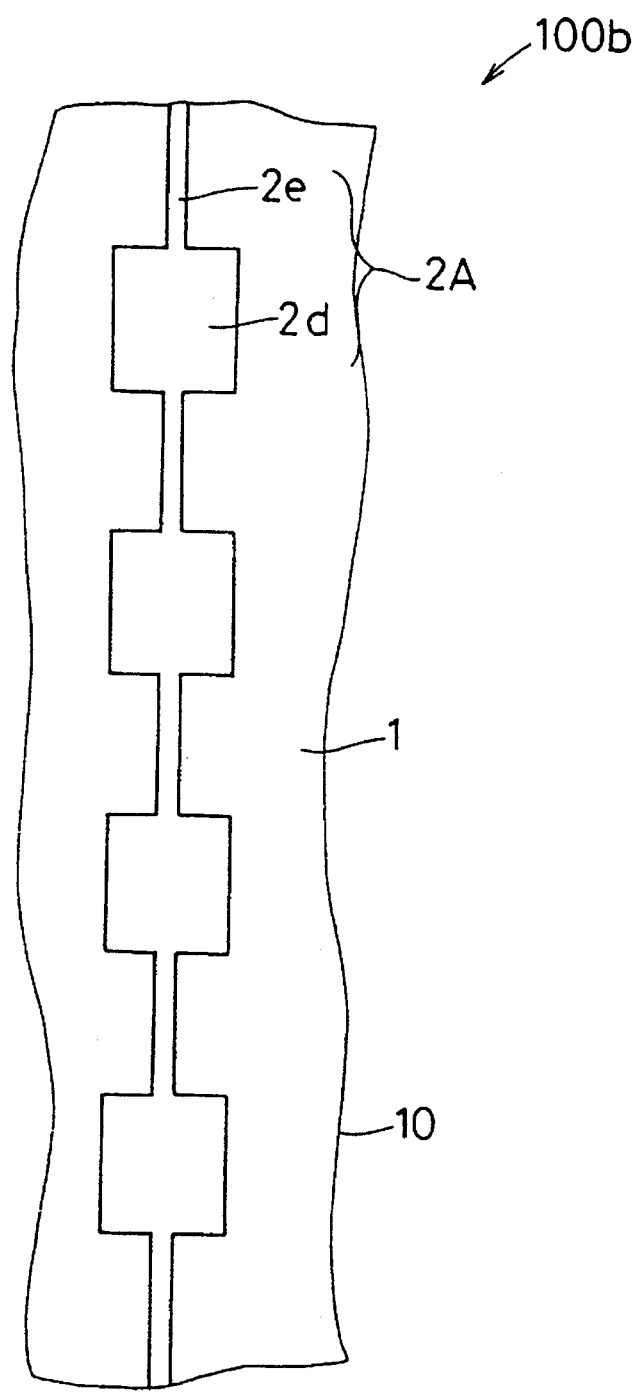
FIG. 26 is a plan view illustrating a semiconductor substrate including a semiconductor film employed in a zone-melting recrystallization process according to the prior art.

Initially, as shown in FIGS. 12(a)–12(c), an insulating film 1 is formed on a substrate 10 and, thereafter, first semiconductor films 18A, each including a plurality of island portions 18a and a plurality of line portions 18b connecting the island portions in series, are formed on the insulating film 1. Then, an insulating film 3a is formed over the entire surface of the substrate and, thereafter, second semiconductor films 18B, each including a plurality of island portions 18c and a plurality of line portions 18d connecting the island portions 18c in series, are formed on the insulating film 3a. The first and second semiconductor films 18A and 18B are of the same conductivity type (first conductivity type). Then, an insulating film 3b is formed over the entire surface of the substrate. Thereafter, the first and second semiconductor films 18A and 18B are subjected to zone-melting recrystallization in the longitudinal direction of these films using a strip heater (not shown). The first and second semiconductor films 18A and 18B comprise polycrystalline silicon or amorphous silicon and do not overlap each other. Each of the insulating films 3a and 3b is a silicon oxide film or a lamination of a silicon oxide film and a silicon nitride film. The island portions 18a and 18c of the first and second semiconductor films 18A and 18B are recrystallized with no subgrain boundaries because of the same principle as already described with respect to FIG. 26, whereby monocrystalline films are produced.

Then, portions of the insulating films 3a and 3b other than portions on the line portions 18b and 18d of the semiconductor films 18A and 18B are selectively removed. Using the insulating films 3a and 3b remaining on the line portions 18b and 18d as a mask, a dopant impurity producing a conductivity type opposite the conductivity type of the semiconductor films 18A and 18B (second conductivity type) is diffused to form impurity diffused regions 19 in the island portions 18a and 18c of the semiconductor films 18A and 18B, producing pn junctions. A dopant impurity that produces n type conductivity, such as phosphorus (P), is used when the first and second semiconductor films 18A and 18B are p type. When these semiconductor films are n type, a dopant impurity that produces p type conductivity, such as boron (B) is used. The resistivity of the first and second semiconductor films 18A and 18B is 1 Ω·cm, and the sheet resistivity of the impurity diffused region 19 is 100 Ω/□.

Figure 15:
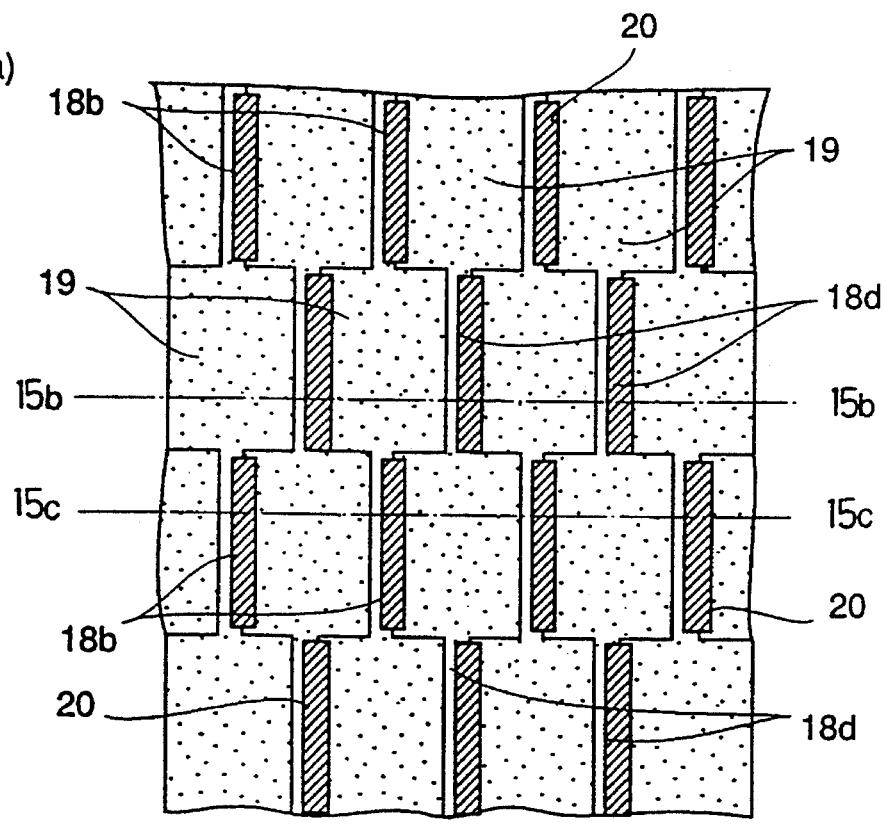
FIG. 15(a) is a plan view for explaining the production of a solar cell in accordance with the ninth embodiment of the present invention.
FIGS. 15(b) and 15(c) are sectional views taken along lines 15b—15 b and 15c—15c of FIG. 15(a), respectively.
Figure 15:
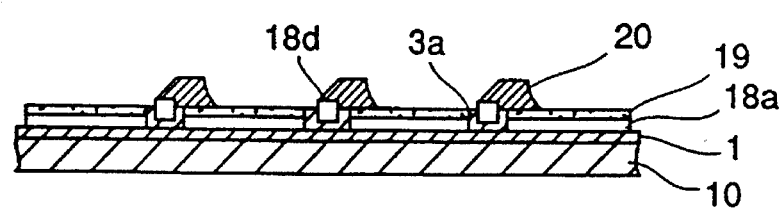
Figure 15:
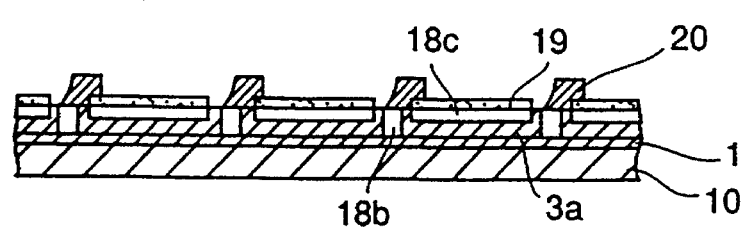

In FIGS. 14(a)–14(c), the insulating films 3a and 3b remaining on the line portions 18b and 18d of the first and second semiconductor films 18A and 18B are removed. Thereafter, as shown in FIGS. 15(a)–15(c), metal electrodes 20 are formed on the exposed line portions 18b and 18d and on portions of the impurity diffused regions 19 adjacent to the respective line portions, whereby the second conductivity type island portions 18a and 18c are electrically connected to the adjacent first conductivity type line portions 18d and 18b, respectively, resulting in an integrated solar cell.

Since the integrated solar cell manufactured as described above includes, as light responsive regions, the monocrystalline semiconductor films 18a and 18c having no subgrain boundaries and formed over the entire surface of the substrate 10, the light-to-electricity conversion efficiency of the solar cell is significantly improved.

While in the above-described ninth embodiment the insulating films 3a and 3b remaining on the line portions 18b and 18d of the semiconductor films 18A and 18B are used as a mask for impurity diffusion, a diffusion mask may be formed after completely removing the insulating films 3a and 3b from the semiconductor films. Alternatively, after the complete removal of the insulating films 3a and 3b, a semiconductor film may be epitaxially grown over the substrate, and a diffusion mask formed on portions of the semiconductor film opposite the line portions 18b and 18d. In both cases, the process steps after the formation of the diffusion mask are the same as described above.

While in the above-described ninth embodiment a method for producing an integrated solar cell is described, a semiconductor substrate after a zone-melting recrystallization of the first and second semiconductor films and the complete removal of the insulating films 3a and 3b may be used as a substrate for semiconductor devices other than solar cell devices.

Figure 16:
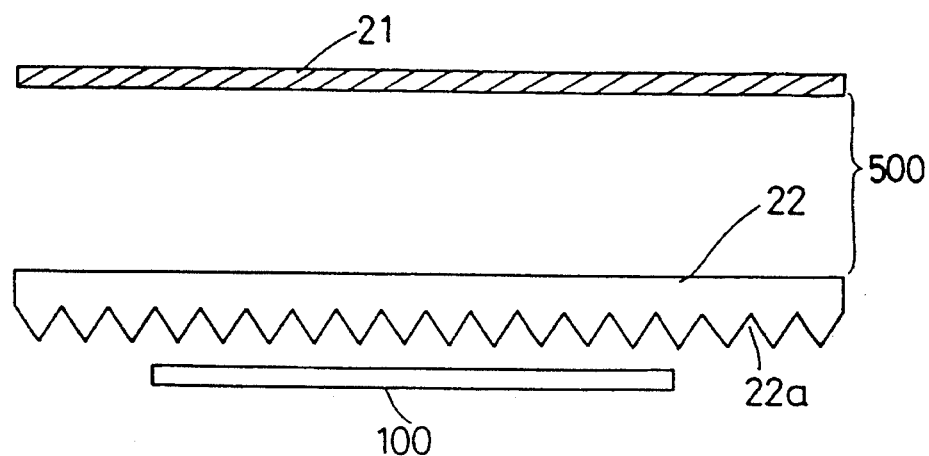
FIG. 16 is a sectional view illustrating an upper heater included in an apparatus for zone-melting recrystallization of semiconductor films in accordance with a tenth embodiment of the present invention.

FIG. 16 is a sectional view illustrating an upper heater included in an apparatus for zone-melting recrystallization of semiconductor films in accordance with a tenth embodiment of the present invention. In FIG. 16, an upper heater 500 comprises a halogen infrared lamp 21 and a grating 22 comprising a quartz glass plate. The halogen infrared lamp 21 is positioned at a prescribed distance from the semiconductor substrate 100. The grating 22 has a plurality of stripe-shaped V grooves 22a on a surface opposite the semiconductor substrate 100. The grating 22 is interposed between the halogen infrared lamp 21 and the semiconductor substrate 100. The pitch of the V grooves 22a is about 300 μm. The halogen infrared lamp 21 is moved in the stripe direction of the V grooves 22a of the grating 22 at a uniform rate.

In this tenth embodiment, the radiation (heat rays) of the strip halogen infrared lamp 21 is diffracted by the V grooves 22a of the grating 22, so that the intensity of heat applied to the semiconductor substrate 100 is varied according to the pitch of the V grooves 22a. Therefore, the unevenness of the solid-liquid boundary formed in the semiconductor film during the zone-melting process is controlled according to the variation in the heat intensity, whereby the position of the subgrain boundary formed in the semiconductor film is controlled. Accordingly, in this tenth embodiment, the position of the subgrain boundary in the zone-melted and recrystallized semiconductor film is controlled without working the semiconductor substrate 100.

Figure 17:
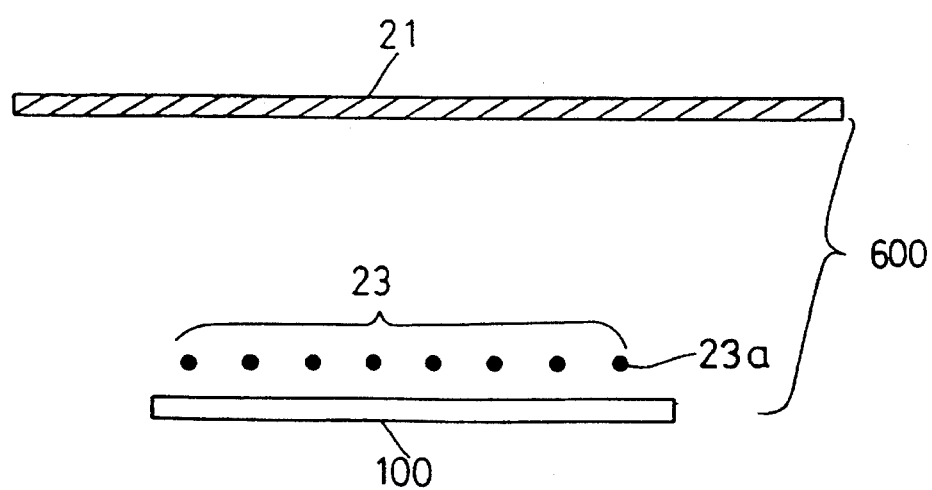
FIG. 17 is a sectional view illustrating an upper heater included in an apparatus for zone-melting recrystallization of semiconductor films in accordance with an eleventh embodiment of the present invention.

FIG. 17 is a sectional view illustrating an upper heater included in an apparatus for zone-melting recrystallization of semiconductor films in accordance with an eleventh embodiment of the present invention. In the figure, an upper heater 600 comprises a halogen infrared lamp 21 and a grating 23. The halogen infrared lamp 21 is positioned at a prescribed distance from the semiconductor substrate 100. The grating 23 comprises a plurality of refractory metal wires 23a, such as tungsten, which are arranged parallel to each other at intervals of 300 μm. The grating 23 is interposed between the halogen infrared lamp 21 and the semiconductor substrate 100. The halogen infrared lamp 21 moves in the longitudinal direction of the wire 23a of the grating 23 at a uniform rate.

In this eleventh embodiment, since the wires 23a of the grating 23 intercept the radiation (heat rays) from the halogen infrared lamp 21, the intensity of heat applied to portions of the semiconductor substrate 100 opposite the wires 23a is reduced, resulting a periodic variation in the heat intensity. The periodically varied heat intensity controls unevenness of the solid-liquid boundary in the semiconductor film during the zone-melting process, whereby the position of the subgrain boundary formed in the semiconductor film is controlled, resulting in the same effects as in the above-described tenth embodiment.

The wires 23a may be in contact with the semiconductor substrate 100. In this case, since heat of the semiconductor substrate 100 is transferred to the wires 23a, the temperature of the semiconductor substrate 100 is reduced at portions in contact with the wires 23a, whereby the heat intensity applied to the semiconductor substrate 100 is periodically varied.

Figure 18:
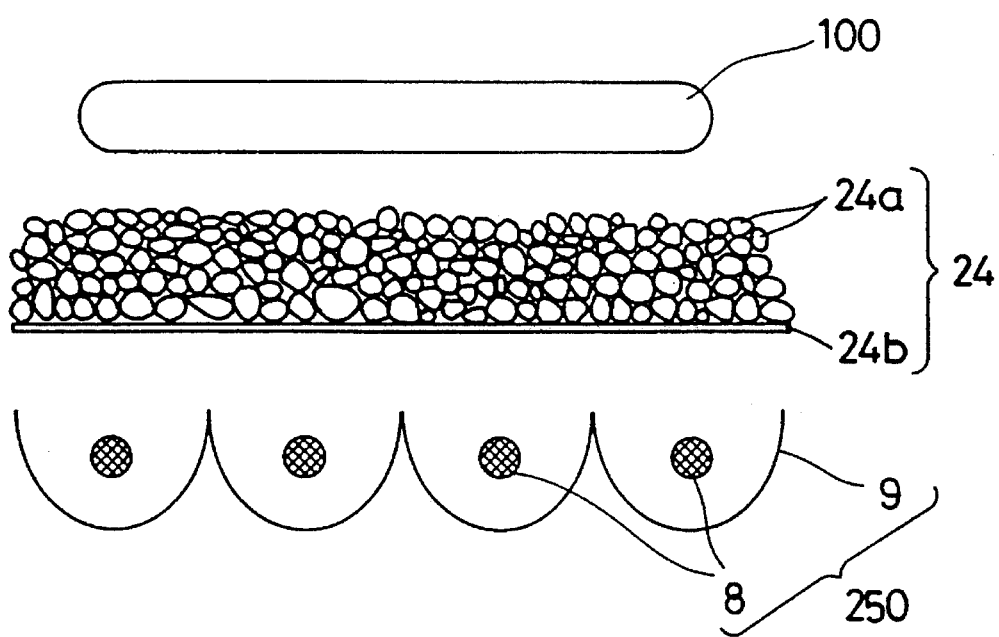
FIG. 18 is a sectional view illustrating a part of an apparatus for producing semiconductor substrates in the vicinity of a lower heater in accordance with a twelfth embodiment of the present invention.

FIG. 18 is a sectional view illustrating a part of an apparatus for producing semiconductor substrates in accordance with a twelfth embodiment of the present invention. In the figure, the same reference numerals as in FIG. 28 designate the same or corresponding parts.

In this apparatus, a lower heater 250 of the same structure as that already described with respect to FIG. 28 is positioned at a prescribed distance under the semiconductor substrate 100. A light scattering plate 24 for scattering radiation from the halogen lamp 8 of the lower heater 250 is interposed between the lower heater 250 and the semiconductor substrate 100. The light scattering plate 24 comprises a quartz plate 24b and quartz grains 24a piled on the quartz plate 24b. Each quartz grain 24a is of a random shape having a diameter smaller than 5 mm. The diameter of the quartz grains 24a must be less than the diameter of the halogen lamp 8, i.e., about 1 cm, to scatter the radiation from the halogen lamp 8 with high efficiency. The thickness of the pile of the quartz grains 24a depends on the distance between the halogen lamp 8 and the light scattering plate 24 and the interval between the light scattering plate 24 and the semiconductor substrate 100. Assuming that the spacing between the halogen lamp 8 and the semiconductor substrate 100 is about 5 cm, a light scattering plate 24 on which quartz grains 24a are piled up to a thickness of about 1 cm is interposed between the lamp and the substrate, whereby sufficient light scattering effect is achieved.

In this apparatus, when radiation (heat rays) from each halogen lamp 8 of the lower heater 250 is transmitted through the light scattering plate 24, it is diffracted and reflected at the surfaces of the innumerable quartz grains 24a due to a difference in refractive indices between quartz and air. The diffracted and reflected radiation scatters in all directions because each quartz grain 24a is of a random shape having a diameter of less than 5 mm. Therefore, the radiation reaches the semiconductor substrate 100 at all angles, so that uniform radiation is applied to the entire surface of the semiconductor substrate 100, whereby the semiconductor substrate 100 is heated uniformly. When this apparatus is employed for zone-melting recrystallization of semiconductor films, semiconductor films with no unmelted portions are produced.

While in the above-described embodiment the light scattering plate 24 is produced by piling up the quartz grains 24a on the quartz plate 24b, it may be produced by molding quartz grains into a plate and adhering that plate to the quartz plate 24b using an appropriate binder, such as resin. Alternatively, the light scattering plate 24 may be formed by annealing quartz grains at the softening temperature of quartz to combine the quartz grains with each other. In both cases, the same effects as described above are achieved.

Figure 19:
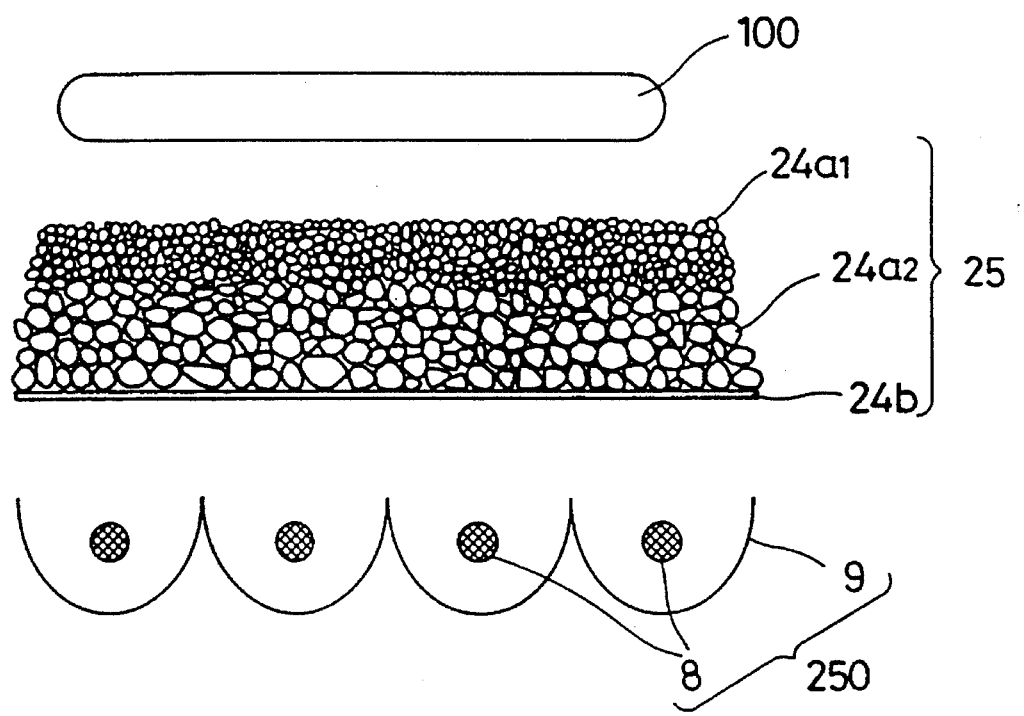
FIG. 19 is a sectional view illustrating a part of an apparatus for producing semiconductor substrates in the vicinity of a lower heater in accordance with a thirteenth embodiment of the present invention.

FIG. 19 is a sectional view illustrating a part of an apparatus for producing semiconductor substrates in accordance with a thirteenth embodiment of the present invention. In the figure, the same reference numerals as in FIG. 18 designate the same or corresponding parts.

In this apparatus, a light scattering plate 25 comprises a quartz plate 24b, quartz grains 24a₂ each having a relatively large diameter of 3 mm~5 mm and piled on the quartz plate 24b, and quartz grains 24a₁ each having a diameter of less than 3 mm and piled on the quartz grains 24a₂. It may be thought that all of the quartz grains included in the light scattering plate should have a small diameter, for example, less than 3 mm, to encourage the scattering of the heat radiation. In this case, however, the transmittance of the radiation from the halogen lamp 8 at the light scattering plate is reduced, whereby the quantity of radiation reaching the semiconductor substrate 100 is reduced compared to the above-described twelfth embodiment.

On the other hand, in this thirteenth embodiment, the radiation from the halogen lamp 8 is roughly scattered by the quartz grains 24a₂ each having a relatively large diameter and, thereafter, it is finely scattered by the quartz grains 24a₁ each having a relatively small diameter, whereby a radiant quantity equivalent to that of the twelfth embodiment is achieved without reducing the transmittance. Also in this embodiment, uniform radiation is applied to the entire surface of the semiconductor substrate 100, whereby the entire surface of the substrate is uniformly heated.

Figure 20:
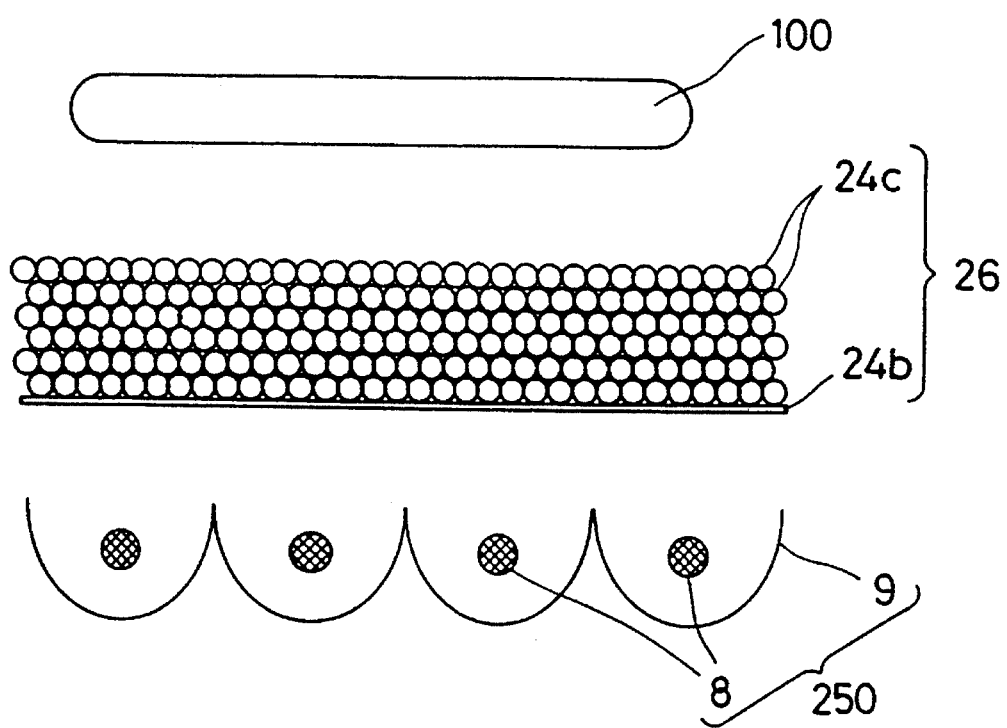
FIG. 20 is a sectional view illustrating a part of an apparatus for producing semiconductor substrates in the vicinity of a lower heater in accordance with a fourteenth embodiment of the present invention.

FIG. 20 is a sectional view illustrating a part of an apparatus for producing semiconductor substrates in accordance with a fourteenth embodiment of the present invention. In the figure, the same reference numerals as in FIG. 18 designate the same or corresponding parts.

In this embodiment, a light scattering plate 26 comprising a quartz plate 24b and a plurality of quartz rods 24c piled on the quartz plate 24b parallel to the halogen lamps 8 is interposed between the heater 250 and the semiconductor substrate 100. The diameter of the quartz rods is less than 5 mm. The reason why the quartz rods 24c are disposed parallel to the strip lamps 8 is that the radiant heat in the longitudinal direction of the halogen lamp 8 is approximately uniform.

In this apparatus, the same effects as in the above-described twelfth embodiment are achieved. Furthermore, since the light scattering plate 26 is formed by piling up the quartz rods 24c on the quartz plate 24b, the formation and the handling of the light scattering plate is simplified compared to the light scattering plate comprising a plurality of quartz grains as in the twelfth embodiment.

Figure 21:
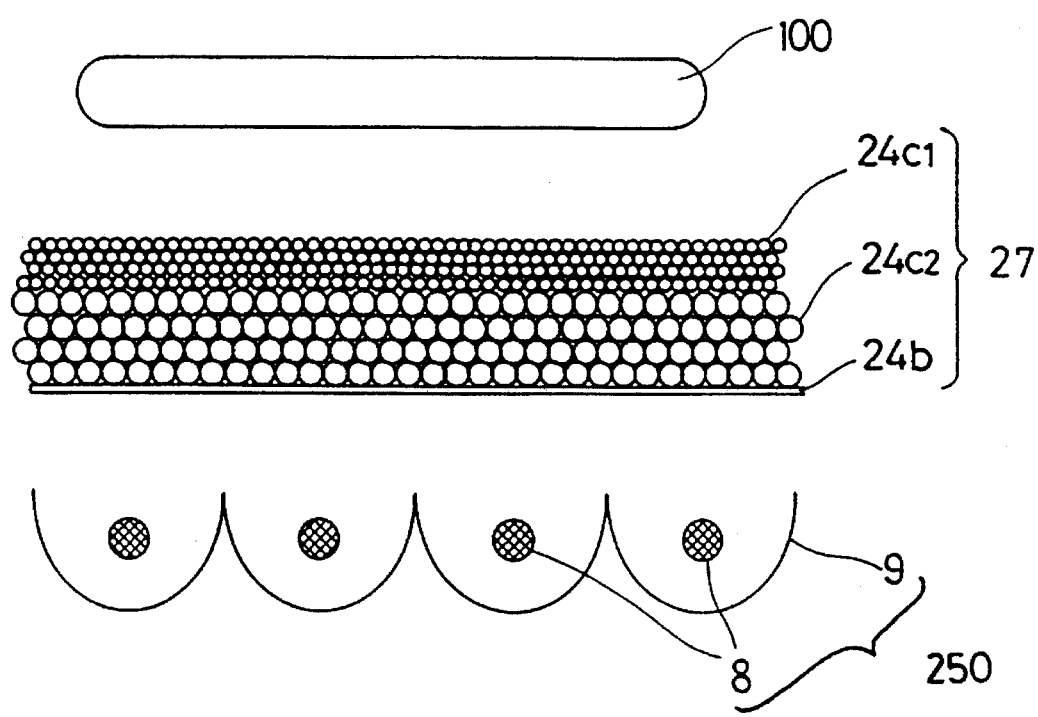
FIG. 21 is a sectional view illustrating a part of an apparatus for producing semiconductor substrates in the vicinity of a lower heater in accordance with a fifteenth embodiment of the present invention.

FIG. 21 is a sectional view illustrating a part of an apparatus for producing semiconductor substrates in accordance with a fifteenth embodiment of the present invention. In the figure, the same reference numerals as in FIG. 18 designate the same or corresponding parts.

In this embodiment, a light scattering plate 27 comprising a quartz plate 24b, a plurality of quartz rods $24c_2$ each having a relatively large diameter of 3 mm~5 mm and piled on the quartz plate 24b, and a plurality of quartz rods $24c_1$ each having a relatively small diameter of less than 3 mm and piled on the quartz rods $24c_2$ is interposed between the semiconductor substrate 100 and the lower heater 250.

In this apparatus, the radiation from each halogen lamp 8 is roughly scattered by the quartz rods $24c_2$ each having a relatively large diameter and finely scattered by the quartz rods $24c_1$ each having a relatively small diameter before reaching the semiconductor substrate 100. Therefore, the same effects as in the above-described thirteenth embodiment are achieved. Furthermore, the formation and the handling of the light scattering plate is simplified compared to the light scattering plate comprising a plurality of quartz grains.

What is claimed is:

1. An apparatus for zone-melting recrystallization of a semiconductor film disposed on a substrate comprising:

a first heater for radiantly heating a rear surface of a substrate; and a second heater for radiantly heating a front surface of the substrate and moving across the substrate at a uniform rate, said second heater comprising a strip heating element and an insulating and refractory material radiating less heat than said strip heating element and covering said strip heating element except opposite the substrate.

2. An apparatus for zone-melting recrystallization of a semiconductor film disposed on a substrate comprising:

a first heater for radiantly heating a rear surface of a substrate; and a second heater for radiantly heating a front surface of the substrate and moving across the substrate at a uniform rate, said second heater comprising a strip heating element and a heat radiation shielding member comprising an insulating and refractory material radiating less heat than said strip heating element, said heat radiation shielding member being spaced from and intercepting heat emitted from said strip heating element except opposite the substrate.

3. An apparatus for zone-melting recrystallization of a semiconductor film disposed on a substrate comprising:

a first heater for radiantly heating a rear surface of a substrate; and a second heater for radiantly heating a front surface of the substrate and moving across the substrate at a uniform rate, said second heater comprising a strip base comprising an insulating and refractory material and a thin heating layer disposed on a surface of the strip base opposite the substrate.

4. An apparatus for zone-melting recrystallization of a semiconductor film disposed on a substrate comprising:

a first heater for radiantly heating a rear surface of a substrate;

a second heater comprising a strip heating element having opposite ends and disposed opposite a front surface of the substrate;

a pair of rollers sandwiching and supporting said strip heating element at the opposite ends; and means for moving said strip heating element across the substrate at a uniform rate, said rollers being fixed to said means for moving.

5. An apparatus for zone-melting recrystallization of a semiconductor film disposed on a substrate comprising:

a first heater for radiantly heating a rear surface of a substrate;

a second heater comprising a strip heating element disposed opposite a front surface of the substrate and moving across the substrate at a uniform rate; and a movable plate comprising a refractory material interposed between said strip heating element and the substrate, said movable plate having a slit opposite said strip heating element through which heat emitted from said strip heating element reaches the substrate.

6. An apparatus for zone-melting recrystallization of a semiconductor film disposed on a substrate comprising:

a first heater for radiantly heating a rear surface of a substrate; and a second heater for radiantly heating a front surface of the substrate and comprising a plurality of alternating strip heating elements and electrically insulating films arranged parallel to each other and laminated together, the respective heating elements generating heat when a voltage is applied to them, whereby a moving heat pattern moving across the front surface of the substrate can be produced by sequential application of voltages to respective strip heating elements without any relative movement between the second heater and the substrate.

7. The apparatus of claim 6 wherein the moving heat pattern generated by said second heater can heat an area larger than the substrate.

8. The apparatus of claim 6 comprising means for selecting a region of each strip heating element where voltage is to be applied.

9. An apparatus for zone-melting recrystallization of a semiconductor film disposed on a substrate comprising:

a first heater for radiantly heating a rear surface of a substrate;

a second heater comprising a strip heating element disposed opposite a front surface of the substrate and moving across the substrate at a uniform rate; and heat intensity controlling means interposed between the strip heating element and the substrate for spatially varying a pattern of heat at the front surface of the substrate produced by the strip heating element so that the pattern of heat at the front surface of the substrate has a periodic spatial intensity variation.

10. The apparatus of claim 9 wherein said strip heating element is a lamp, said heat intensity controlling means is a quartz plate having a plurality of stripe-shaped V grooves at a surface opposite the substrate the quartz plate being interposed between said lamp and the substrate so that the stripe-shaped V grooves are perpendicular to said lamp.

11. The apparatus of claim 9 wherein said heat intensity controlling means comprises a plurality of refractory metal wires arranged parallel to each other and perpendicular to said strip heating element.

12. An apparatus for zone-melting recrystallization of a film including:

a heater for radiantly heating a rear surface of a substrate, said heater comprising a light reflecting member having a plurality of stripe-shaped concave portions parallel to each other, each concave portion having a specular inner surface and an arch-shaped cross section, and a plurality of lamps, each lamp being disposed in the concave portion of one of said light reflecting members; and light scattering means interposed between said heater and the substrate for scattering radiation from said lamp.

13. The apparatus of claim 12 wherein said light scattering means comprises a quartz plate and a plurality of quartz grains piled on the quartz plate, each grain having a diameter of less than 5 mm.

14. The apparatus of claim 12 wherein said light scattering means comprises a quartz plate, a first light scattering layer comprising a plurality of first quartz grains each having a diameter of 3~5 mm piled on said quartz plate, and a second light scattering layer comprising a plurality of second quartz grains each having a diameter of less than 3 mm piled on said first light scattering layer.

15. The apparatus of claim 12 wherein said light scattering means comprises a quartz plate and a plurality of quartz bars piled on said quartz plate, each rods having a diameter of less than 5 mm.

16. The apparatus of claim 12 wherein said light scattering means comprises a quartz plate, a plurality of first quartz rods each having a diameter of 3~5 mm rods on the quartz plate, and a plurality of second quartz bars each having a diameter of less than 3 mm piled on said first quartz rods.

* * * * *

UNITED STATES PATENT AND TRADEMARK OFFICE
CERTIFICATE OF CORRECTION

PATENT NO. : 5,540,183
DATED : July 30, 1996
INVENTOR(S) : Deguchi et al.

It is certified that error appears in the above-indentified patent and that said Letters Patent is hereby corrected as shown below:

Column 18, Line 47, after "substrate" insert --,--;

Column 20, Line 1, change "bars" to --rods--;

Line 1, change "rods" to --rod--;

Line 6, change "rods" (second occurrence) to --piled--;

Line 7, change "bars" to --rods--.

Signed and Sealed this

Seventh Day of January, 1997

Attest:

BRUCE LEHMAN

Attesting Officer     Commissioner of Patents and Trademarks